United States Patent
Yamamoto et al.

(10) Patent No.: US 11,282,884 B2
(45) Date of Patent: Mar. 22, 2022

(54) SOLID-STATE IMAGING DEVICE AND METHOD FOR PRODUCING THE SAME, AND ELECTRONIC DEVICE

(71) Applicant: SONY SEMICONDUCTOR SOLUTIONS CORPORATION, Kanagawa (JP)

(72) Inventors: Junpei Yamamoto, Kanagawa (JP); Takushi Shigetoshi, Nagasaki (JP); Takanori Tada, Nagasaki (JP); Shinpei Fukuoka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/466,370

(22) PCT Filed: Dec. 14, 2017

(86) PCT No.: PCT/JP2017/044856
§ 371 (c)(1),
(2) Date: Jun. 4, 2019

(87) PCT Pub. No.: WO2018/110636
PCT Pub. Date: Jun. 21, 2018

(65) Prior Publication Data
US 2019/0326345 A1 Oct. 24, 2019

(30) Foreign Application Priority Data

Dec. 14, 2016 (JP) .............................. JP2016-242144
Nov. 10, 2017 (JP) .............................. JP2017-217217

(51) Int. Cl.
*H01L 27/30* (2006.01)
*H01L 27/146* (2006.01)

(52) U.S. Cl.
CPC .... *H01L 27/14636* (2013.01); *H01L 27/1463* (2013.01); *H01L 27/14605* (2013.01);
(Continued)

(58) Field of Classification Search
CPC ........... H01L 27/1463; H01L 27/14636; H01L 27/14647; H01L 23/481; H01L 27/14605;
(Continued)

(56) References Cited

U.S. PATENT DOCUMENTS

2011/0156104 A1  6/2011  Yamaguchi
2012/0139127 A1  6/2012  Beyne
(Continued)

FOREIGN PATENT DOCUMENTS

EP      2463896          6/2012
JP   2006269923 A       10/2006
(Continued)

OTHER PUBLICATIONS

International Search Report and Written Opinion prepared by the European Patent Office dated Apr. 5, 2018, for International Application No. PCT/JP2017/044856.

*Primary Examiner* — Meiya Liz
(74) *Attorney, Agent, or Firm* — Sheridan Ross P.C.

(57) ABSTRACT

There is provided an imaging device with a semiconductor substrate having a first side and a second side opposite the first side. A photoelectric conversion unit is on the first side of the semiconductor substrate. A multilayer wiring layer is on the second side of the semiconductor substrate. A through electrode extends between the photoelectric conversion unit and the multilayer wiring layer. The multilayer wiring layer includes a local wiring layer. A second end of the through electrode is in direct contact with the local wiring layer.

16 Claims, 60 Drawing Sheets

(52) U.S. Cl.
CPC .. *H01L 27/14612* (2013.01); *H01L 27/14647* (2013.01); *H01L 27/14689* (2013.01)

(58) Field of Classification Search
CPC ......... H01L 27/14612; H01L 27/14689; H01L 21/76898; H01L 27/14638; H01L 27/1464; H01L 27/14641; H01L 27/14665; H01L 27/14667; H01L 27/14687; H01L 27/307; H01L 51/42
See application file for complete search history.

(56) References Cited

U.S. PATENT DOCUMENTS

| | | | |
|---|---|---|---|
| 2013/0033628 A1 | 2/2013 | Yamaguchi | |
| 2013/0341491 A1* | 12/2013 | Hirose | H01L 27/14638 250/208.1 |
| 2014/0209876 A1 | 7/2014 | Yamaguchi et al. | |
| 2015/0334327 A1 | 1/2015 | Yamaguchi | |
| 2015/0194489 A1 | 7/2015 | Joei | |
| 2016/0064440 A1 | 3/2016 | Yamaguchi et al. | |
| 2016/0133865 A1 | 5/2016 | Yamaguchi | |
| 2016/0190211 A1 | 6/2016 | Joei | |
| 2016/0204156 A1 | 7/2016 | Togashi | |
| 2016/0233873 A1 | 10/2016 | Yamaguchi | |
| 2016/0329380 A1 | 11/2016 | Yamaguchi | |
| 2017/0170238 A1* | 6/2017 | Lee | H01L 27/14627 |
| 2017/0287982 A1 | 10/2017 | Joei | |
| 2018/0006073 A1 | 1/2018 | Togashi | |
| 2018/0013961 A1* | 1/2018 | Lee | H04N 5/332 |
| 2018/0047789 A1 | 2/2018 | Yamaguchi | |
| 2018/0090533 A1 | 3/2018 | Otake et al. | |
| 2018/0097036 A1 | 4/2018 | Otake et al. | |

FOREIGN PATENT DOCUMENTS

| | | |
|---|---|---|
| JP | 2015012126 A | 1/2015 |
| JP | 2015-038931 | 2/2015 |
| JP | 2015053296 A | 3/2015 |
| JP | 2016029731 A | 3/2016 |
| WO | WO 2016/189792 | 3/2015 |
| WO | WO 2015/029425 | 12/2016 |

* cited by examiner

SOLID-STATE IMAGING DEVICE AND METHOD FOR PRODUCING THE SAME, AND ELECTRONIC DEVICE

CROSS REFERENCE TO RELATED APPLICATIONS

This application is a national stage application under 35 U.S.C. 371 and claims the benefit of PCT Application No. PCT/JP2017/044856 having an international filing date of 14 Dec. 2017, which designated the United States, which PCT application claimed the benefit of Japanese Priority Patent Application Nos. 2016-242144 filed on 14 Dec. 2016 and 2017-217217 filed on 10 Nov. 2017, the disclosures of each of which are incorporated herein by reference.

TECHNICAL FIELD

The present technology relates to a solid-state imaging device and a method for producing the same, and an electronic device, and particularly relates to a solid-state imaging device and a method for producing the same and an electronic device that can make a through electrode finer.

BACKGROUND ART

Recent years have seen a reduction in pixel size in charge coupled device (CCD) image sensors and complementary metal oxide semiconductor (CMOS) image sensors. This, however, leads to lower sensitivity due to a decrease in photons that enter a unit pixel, and lower S/N.

Meanwhile, as a pixel array in which red (R), green (G), and blue (B) pixels are arranged on a plane, a Bayer arrangement using primary color filters, for example, is widely known at present. In the Bayer arrangement, however, light of G and B does not pass through the color filter and is not used for photoelectric conversion in the R pixel; thus, loss occurs in terms of sensitivity, and false color is caused by interpolation processing between pixels.

In regard to these, a technique of stacking three photoelectric conversion layers in the vertical direction and obtaining color signals for three colors in one pixel has been known. For example, a structure has been proposed in which a photoelectric conversion film provided on a Si substrate detects light of G, and two photodiodes (PDs) stacked in the Si substrate detect light of R and B.

In such a structure, charge generated in the photoelectric conversion film needs to be transferred to a floating diffusion (FD) that is formed on the opposite surface of the Si substrate. In regard to this, for example, JP 2015-38931A discloses a structure in which a through electrode is provided for each pixel between the front surface and the back surface of a semiconductor substrate, and charge generated in a photoelectric conversion film is transferred to a FD.

SUMMARY OF INVENTION

Technical Problem

However, the structure disclosed in PTL 1 cannot make the through electrode finer. Specifically, there is a limit to making a Si through electrode finer, in terms of production steps. In addition, a metal through electrode may be misaligned with a contact connected at the front surface or the back surface of the semiconductor substrate, which may increase contact resistance.

The present technology makes it possible to make a through electrode finer reliably.

Solution to Problem

According to an embodiment of the present technology, there is provided an imaging device comprising: a semiconductor substrate having a first side and a second side opposite the first side; a photoelectric conversion unit on the first side of the semi-conductor substrate; a multilayer wiring layer on the second side of the semiconductor substrate; a through electrode that extends between the photoelectric conversion unit and the multilayer wiring layer, wherein the multilayer wiring layer includes a local wiring layer, and wherein a second end of the through electrode is in direct contact with the local wiring layer.

According to an embodiment of the present technology, there is provided An electronic apparatus, comprising: a plurality of pixels, wherein each of the pixels includes: a photoelectric conversion unit on the first side of the semiconductor substrate; at least a first photodiode formed in the semiconductor substrate; a multilayer wiring layer on the second side of the semiconductor substrate; a through electrode that extends between the photoelectric conversion unit and the multilayer wiring layer, wherein the multilayer wiring layer includes a local wiring layer, and wherein a second end of the through electrode is in direct contact with the local wiring layer.

Advantageous Effects of Invention

According to an embodiment of the present technology, a through electrode can be made finer reliably. Note that effects described herein are not necessarily limitative, and any effect described in the present disclosure may be exhibited.

DESCRIPTION OF EMBODIMENTS

Figure 1:
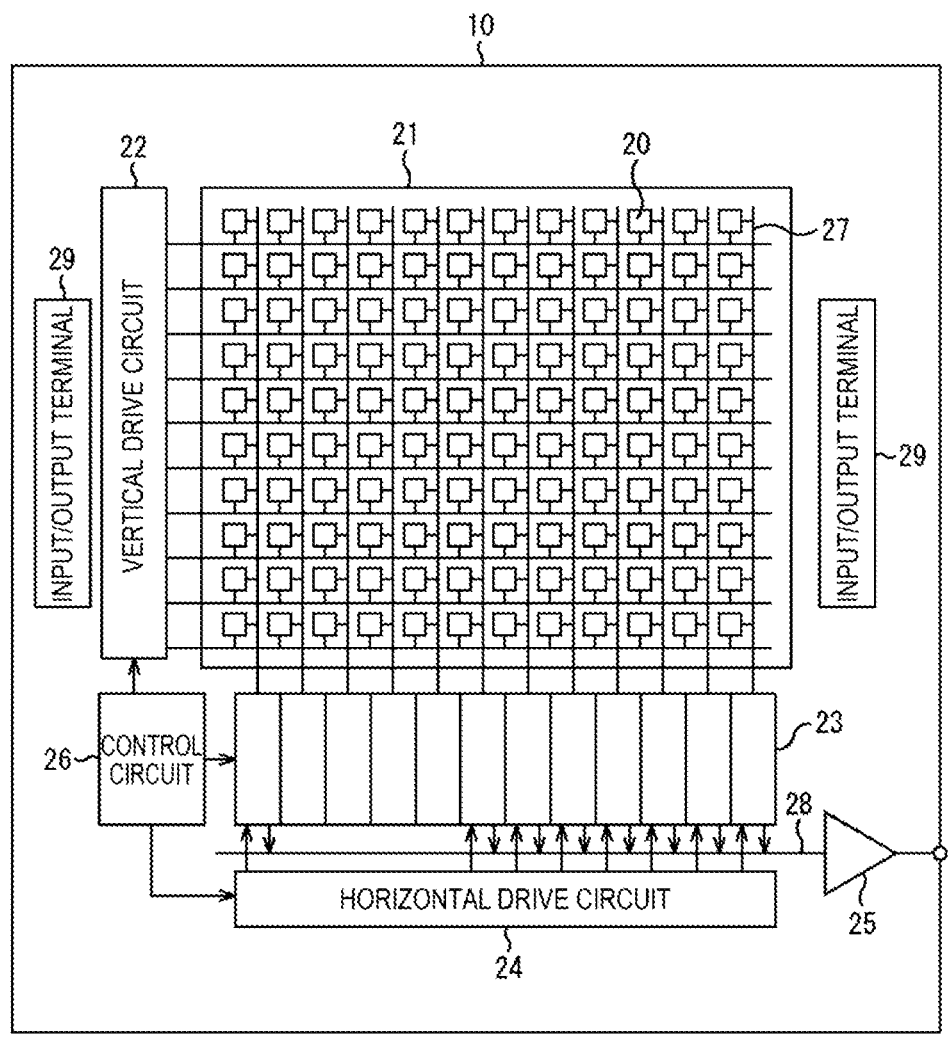
FIG. 1 is a block diagram illustrating a configuration example of a solid-state imaging device of an embodiment of the present technology.

Hereinafter, modes (hereinafter called embodiments) for carrying out the present disclosure will be described. The description is given in the following order.

1. Configuration example of solid-state imaging device
2. First embodiment
3. Production steps of pixel
4. Second embodiment
5. Production steps of configuration in which voltage is applied to upper electrode
6. Third embodiment
7. Production steps of configuration in which through electrode and fixed charge film are not in contact with each other
8. Fourth embodiment
9. Production steps of forming through electrode from substrate front surface
10. Configuration example of electronic device
11. Usage examples of image sensor

1. Configuration Example of Solid-State Imaging Device

FIG. 1 is a block diagram illustrating a configuration example of a solid-state imaging device of an embodiment of the present technology.

A solid-state imaging device 10 is configured as a CMOS image sensor. The solid-state imaging device 10 includes a pixel area (pixel array) 21 in which a plurality of pixels 20 are regularly arranged in a two-dimensional array in a semiconductor substrate (e.g., a Si substrate), which is not illustrated, and a peripheral circuit unit.

The pixel 20 includes a photoelectric conversion unit (e.g., a photodiode) and a plurality of pixel transistors (MOS transistors). The plurality of pixel transistors may include, for example, three transistors of a transfer transistor, a reset transistor, and an amplification transistor. Alternatively, the plurality of pixel transistors may include four transistors additionally including a selection transistor. Note that an equivalent circuit of a unit pixel is similar to a general one, and therefore detailed description thereof is omitted.

The pixel 20 may be configured as one unit pixel, or may be in a pixel sharing structure. This pixel sharing structure is a structure in which a plurality of photodiodes share a floating diffusion and transistors other than a transfer transistor.

Although detailed description will be given later, the pixel 20 is constituted by stacking photoelectric conversion units.

The peripheral circuit unit includes a vertical drive circuit 22, column signal processing circuits 23, a horizontal drive circuit 24, an output circuit 25, and a control circuit 26.

The control circuit 26 receives an input clock and data commanding an operation mode or the like, and outputs data such as internal information of the solid-state imaging device 10. In addition, on the basis of a vertical synchronizing signal, a horizontal synchronizing signal, and a master clock, the control circuit 26 generates a clock signal and a control signal that serve as a reference for the operation of the vertical drive circuit 22, the column signal processing circuits 23, the horizontal drive circuit 24, and the like. Then, the control circuit 26 inputs these signals to the vertical drive circuit 22, the column signal processing circuits 23, the horizontal drive circuit 24, and the like.

The vertical drive circuit 22 is constituted by a shift register, for example. The vertical drive circuit 22 selects a pixel drive line, and supplies a pulse for driving pixels to the selected pixel drive line to drive pixels in units of rows. That is, the vertical drive circuit 22 selectively scans the pixels 20 of the pixel area 21 sequentially in the vertical direction in units of rows. Then, the vertical drive circuit 22 supplies pixel signals based on signal charge generated in accordance with the amount of received light in the photoelectric conversion units of the respective pixels 20 to the column signal processing circuits 23 through vertical signal lines 27.

A column signal processing circuit 23 is disposed for each column of the pixels 20, for example. The column signal processing circuits 23 perform signal processing such as noise cancellation on signals output from the pixels 20 of one row, in units of pixel columns. Specifically, the column signal processing circuits 23 perform signal processing such as correlated double sampling (CDS) for cancelling fixed pattern noise peculiar to the pixel 20, signal amplification, and analog/digital (A/D) conversion. In the output stage of the column signal processing circuit 23, a horizontal selection switch (not illustrated) is provided to be connected to a horizontal signal line 28.

The horizontal drive circuit 24 is constituted by a shift register, for example. The horizontal drive circuit 24 sequentially outputs a horizontal scanning pulse to select the column signal processing circuits 23 in order, and causes the column signal processing circuits 23 to output pixel signals to the horizontal signal line 28.

The output circuit 25 performs signal processing on signals sequentially supplied from the column signal processing circuits 23 through the horizontal signal line 28, and outputs the resulting signals. For example, the output circuit 25 performs only buffering in some cases, and performs black level adjustment, column variation correction, various digital signal processing, and the like in some cases.

Input/output terminals 29 exchange signals with the outside.

2. First Embodiment

Figure 2:
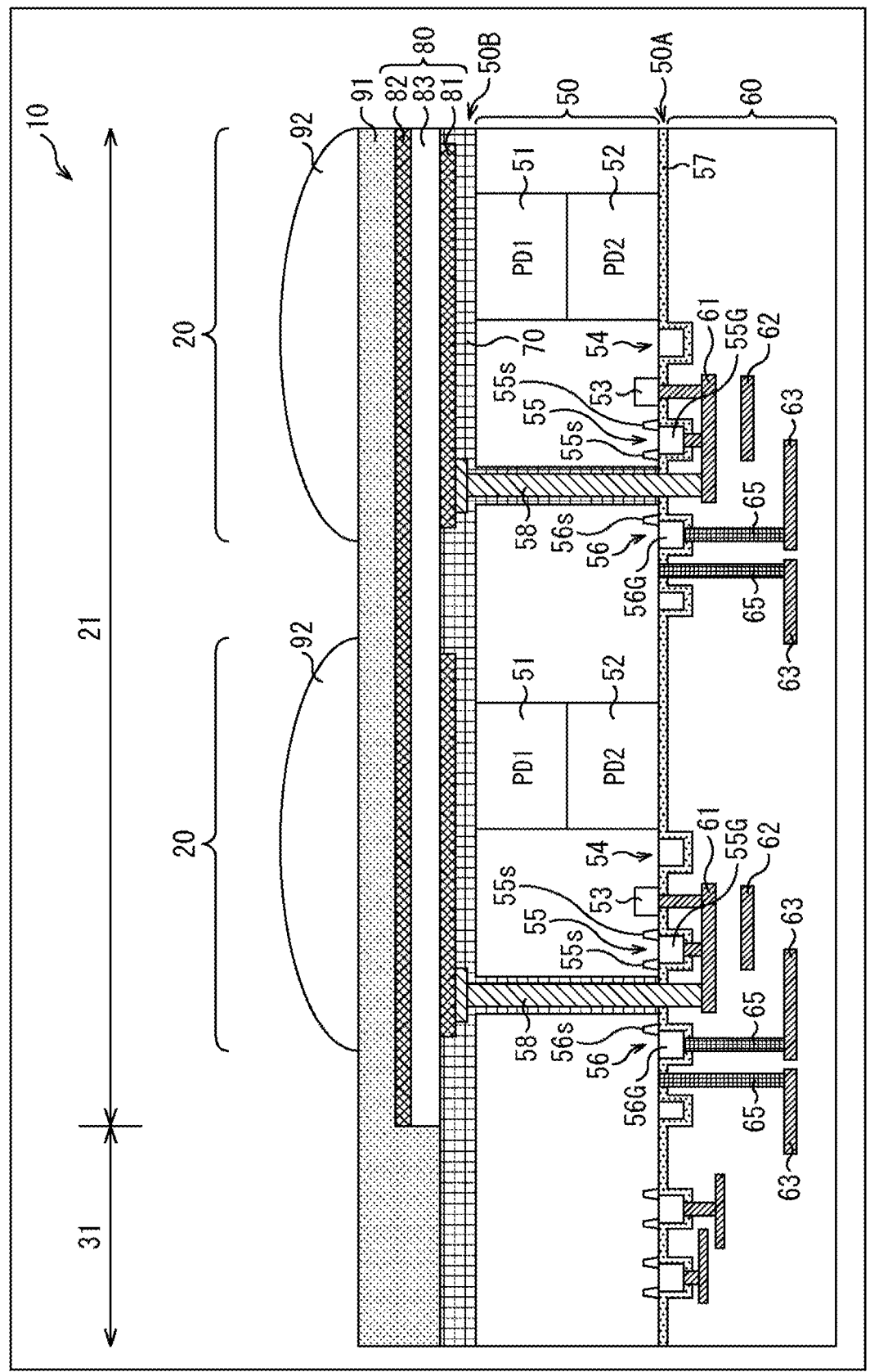
FIG. 2 is a cross-sectional view of a configuration example of a solid-state imaging device according to a first embodiment.

FIG. 2 is a cross-sectional view of the solid-state imaging device 10 according to a first embodiment of the present technology.

FIG. 2 illustrates a cross-section of the pixel area 21 and a peripheral circuit unit 31 included in the solid-state imaging device 10.

In the solid-state imaging device 10, a multilayer wiring layer 60 is formed on the front surface 50A (first surface) side of a semiconductor substrate 50, which is made of Si or the like. In addition, an organic photoelectric conversion unit 80 serving as a photoelectric conversion element is formed on the back surface 50B (second surface) side of the semiconductor substrate 50 with an insulating film 70 therebetween, the back surface 50B serving as a light-receiving surface.

In the pixel area 21, each pixel 20 has a stacked structure in which one organic photoelectric conversion unit 80 and two inorganic photoelectric conversion units 51 and 52 (PD1 and PD2), which selectively detect light of different wavelength ranges and perform photoelectric conversion, are stacked in the vertical direction. The inorganic photoelectric conversion units 51 and 52 are formed to be embedded in the semi-conductor substrate 50.

The organic photoelectric conversion unit 80 includes two or more types of organic semiconductor materials, for example. The organic photoelectric conversion unit 80 is configured with an organic photoelectric conversion element that uses organic semiconductors to absorb light of a selective wavelength range (here, green light) to generate electron-hole pairs. The organic photoelectric conversion unit 80 has a configuration in which an organic photoelectric conversion layer (organic semiconductor layer) 83 is sandwiched between a lower electrode 81 provided for each pixel 20 and used for extracting signal charge and an upper electrode 82 provided to be shared by the pixels 20.

The lower electrode 81 is provided in an area that faces light-receiving surfaces of the inorganic photoelectric conversion units 51 and 52 formed in the semiconductor substrate 50 and covers these light-receiving surfaces. The lower electrode 81 is constituted by an optically transparent conductive film, and for example is constituted by indium tin oxide (ITO). As well as indium tin oxide, a tin oxide ($SnO_2$) based material to which a dopant is added or a zinc oxide-based material obtained by adding a dopant to aluminum zinc oxide (ZnO) may be used as a constituent material of the lower electrode 81. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. As well as these, CuI, $InSbO_4$, ZnMgO, $CuInO_2$, $MgIN_2O_4$, CdO, $ZnSnO_3$, or the like may be used. Note that the lower electrode 81 is provided separately for each pixel 20, because signal charge (electrons) obtained in the organic photoelectric conversion layer 83 is extracted from the lower electrode 81.

The organic photoelectric conversion layer 83 includes three types of organic semi-conductor materials of a first organic semiconductor material, a second organic semiconductor material, and/or a third organic semiconductor material, for example. At least one of these three types of organic semiconductor materials is one or both of an organic p-type semiconductor and an organic n-type semiconductor, and photoelectrically converts light of a selective wavelength range while passing light of another wavelength range. Specifically, the organic photoelectric conversion layer 83 has a maximum absorption wavelength in a range of equal to or more than 450 nm and equal to or less than 650 nm as wavelengths of green (G) light, for example.

Another layer that is not illustrated may be provided between the organic photoelectric conversion layer 83 and the lower electrode 81, and between the organic photoelectric conversion layer 83 and the upper electrode 82. For example, a base film, a hole transport layer, an electron blocking film, the organic photoelectric conversion layer 83, a hole blocking film, a buffer film, an electron transport layer, and a work function adjustment film may be stacked in order from the lower electrode 81 side.

The upper electrode 82 is constituted by an optically transparent conductive film similar to the lower electrode 81. The upper electrode 82 is formed as an electrode shared by the pixels 20, but also may be separated for each pixel 20. The thickness of the upper electrode 82 is, for example, 10 nm to 200 nm.

The inorganic photoelectric conversion units 51 and 52 are photodiodes (PDs) having a p-n junction, and are formed in this order from the back surface 50B side on an optical path in the semiconductor substrate 50. The inorganic photoelectric conversion unit 51 selectively detects blue light and accumulates signal charge corresponding to blue. The inorganic photoelectric conversion unit 51 is formed in a selective area along the back surface 50B of the semiconductor substrate 50, for example. The inorganic photoelectric conversion unit 52 selectively detects red light and accumulates signal charge corresponding to red. The inorganic photoelectric conversion unit 52 is formed in an area below the inorganic photoelectric conversion unit 51 (on the front surface 50A side), for example. Note that blue (B) is a color corresponding to a wavelength range of 450 nm to 495 nm, for example, and red (R) is a color corresponding to a wavelength range of 620 nm to 750 nm, for example; it is sufficient for the inorganic photoelectric conversion units 51 and 52 to be able to detect light of part or all of the respective wavelength ranges.

As described above, the pixel 20 has a stacked structure in which the organic photoelectric conversion unit 80 and two inorganic photoelectric conversion units 51 and 52 are stacked in the vertical direction, and the organic photoelectric conversion unit 80, the inorganic photoelectric conversion unit 51, and the inorganic photoelectric conversion unit 52 respectively absorb (detect) green light, blue light, and red light and perform photoelectric conversion; thus, vertical spectral diffraction in the vertical direction (layer direction) can be performed in one pixel, and color signals of red, green, and blue can be acquired.

On the front surface 50A of the semiconductor substrate 50, for example, a floating diffusion (FD) 53, a transfer transistor 54, an amplification transistor 55, and a reset transistor 56 are provided. Of these, the FD 53 and a gate electrode 55G of the amplification transistor 55 are connected to a local wiring layer 61 that is formed closest to the front surface 50A of the semiconductor substrate 50 among wiring layers 61 to 63 constituting the multilayer wiring layer 60. The local wiring layer 61 is provided for each pixel 20. In addition, a gate electrode 56G of the reset transistor 56 is connected to the wiring layer 63 via a contact 65. Note that the amplification transistor 55 is separated from other areas by an element isolation portion 55s having a shallow trench isolation (STI) structure, and the reset transistor 56 is separated from other areas by an element isolation portion 56s.

Furthermore, on the front surface 50A of the semiconductor substrate 50, an etch stop layer 57 made of a SiN film or the like is formed.

In each pixel 20, a through electrode 58 is formed in the semiconductor substrate 50 in a manner that its lower end penetrates the front surface 50A of the semiconductor substrate 50 to be directly connected to the local wiring layer 61, and its upper end is connected to the lower electrode 81. In particular, on the front surface 50A side of the semiconductor substrate 50, the through electrode 58 is formed so as to penetrate between the element isolation portion 55s of the amplification transistor 55 and the element isolation portion 56s of the reset transistor 56. The through electrode 58 is constituted by a metal material, such as tungsten (W) copper (Cu), aluminum (Al), titanium (Ti), cobalt (Co), hafnium (Hf), or tantalum (Ta).

Thus, in each pixel 20, charge generated in the organic photoelectric conversion unit 80 on the back surface 50B side of the semiconductor substrate 50 is transferred to the FD 53 and the amplification transistor 55 on the front surface 50A side of the semiconductor substrate 50, via the through electrode 58.

In addition, in each pixel 20, a passivation film 91 is formed on the upper electrode 82, and an on-chip lens 92 is formed on the passivation film 91.

3. Production Steps of Pixel

Next, production steps of the pixel 20 will be described with reference to FIGS. 3 to 15.

Figure 3:
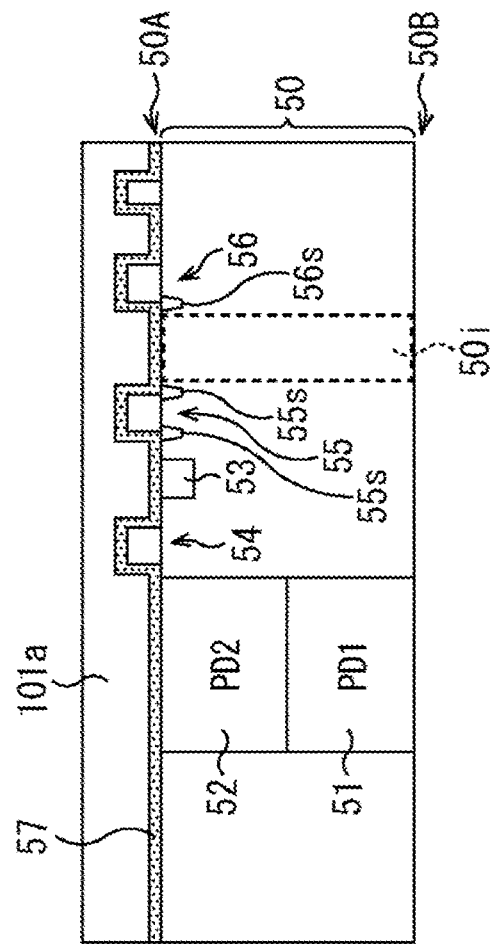
FIG. 3 is a cross-sectional view illustrating a production step of a pixel.

First, FIG. 3 illustrates a state where, on the front surface 50A side of the semiconductor substrate 50 in which the inorganic photoelectric conversion units 51 and 52 and the FD 53 are formed, the transistors 54 to 56 are formed by ion implantation or the like, and the etch stop layer 57 and an interlayer insulating film 101a are formed. The etch stop layer 57 is formed by forming a SiN film or the like by a technique such as low pressure-chemical vapor deposition (LP-CVD), for example. The interlayer insulating film 101a is formed by forming an oxide film or the like by a technique such as plasma CVD, and planarizing the surface by a technique such as chemical mechanical polishing (CMP). Note that a high-concentration impurity area (P++ area) may be formed in an area 50i where the through electrode 58 is to be formed in the semiconductor substrate 50. Thus, damage caused when the through electrode 58 is formed can be reduced, and consequently dark current can be reduced.

Figure 4:
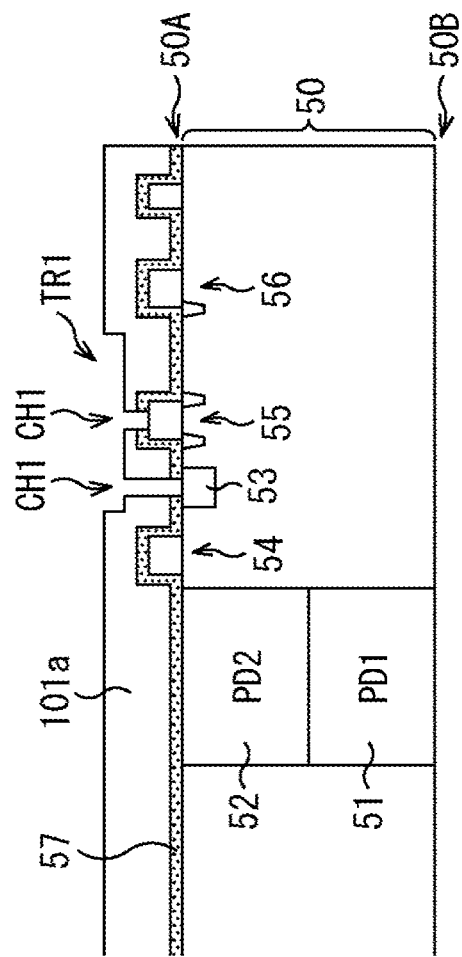
FIG. 4 is a cross-sectional view illustrating a production step of a pixel.

Next, as illustrated in FIG. 4, contact holes CH1 for connecting the local wiring layer 61 to the semiconductor substrate 50 (the FD 53 and the amplification transistor 55) are formed by patterning and dry etching. Furthermore, a trench TR1 for the local wiring layer 61 is formed by patterning and dry etching.

Figure 5:
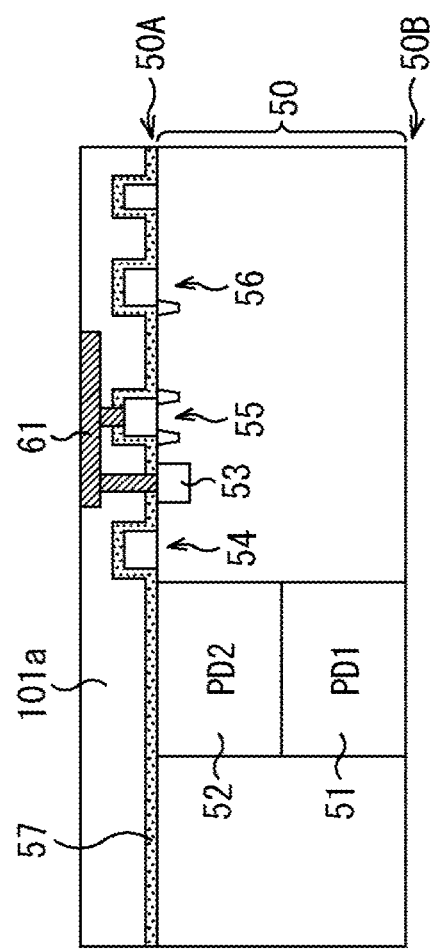
FIG. 5 is a cross-sectional view illustrating a production step of a pixel.

After that, as illustrated in FIG. 5, metal is embedded in the contact holes CH1 and the trench TR1 to form contacts and the local wiring layer 61. For example, a Ti film or the like for work function adjustment is formed by a technique such as physical vapor deposition (PVD), and barrier metal TiN, W, etc. are embedded by a technique such as CVD. Furthermore, an unnecessary metal film on the surface is removed by a technique such as CMP.

In this manner, the local wiring layer 61 connected to one end of the through electrode 58 is formed of a metal that is less likely to cause contamination, such as W or Ti.

Figure 6:
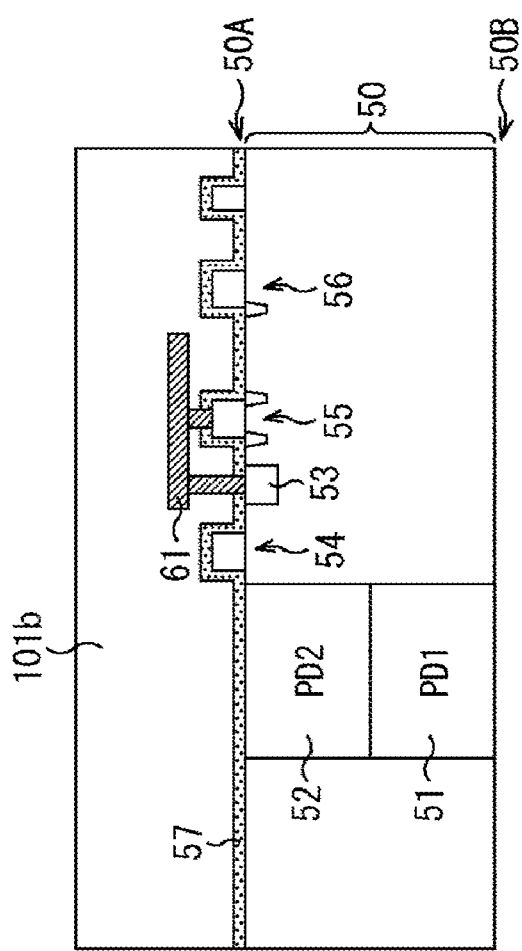
FIG. 6 is a cross-sectional view illustrating a production step of a pixel.

Subsequently, as illustrated in FIG. 6, an insulating film 101b is formed on the local wiring layer 61 by forming an oxide film or the like by a technique such as plasma CVD.

Figure 7:
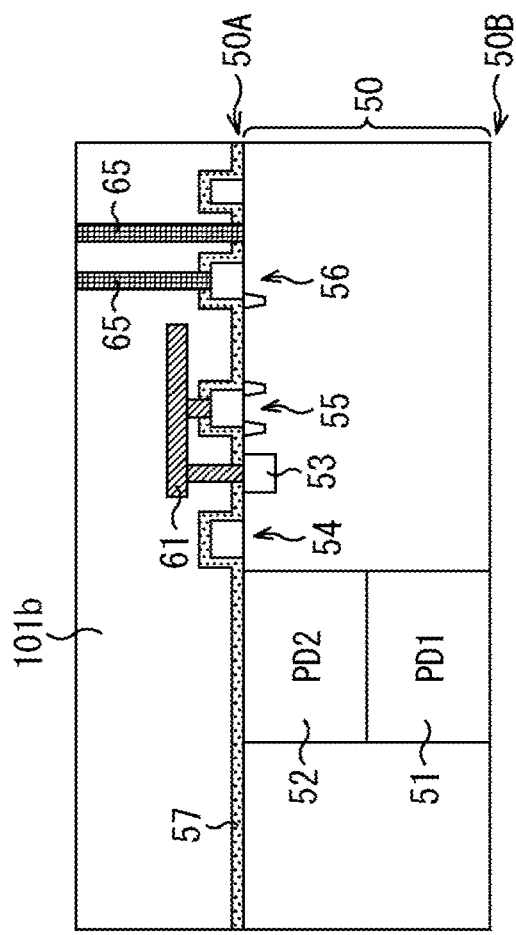
FIG. 7 is a cross-sectional view illustrating a production step of a pixel.

Then, as illustrated in FIG. 7, contact holes are formed by patterning and dry etching, and metal is embedded to form the contacts 65. For example, a Ti film or the like for work function adjustment is formed by a technique such as PVD, and barrier metal TiN, W, etc. are embedded by a technique such as CVD. Furthermore, an unnecessary metal film on the surface is removed by a technique such as CMP.

Figure 8:
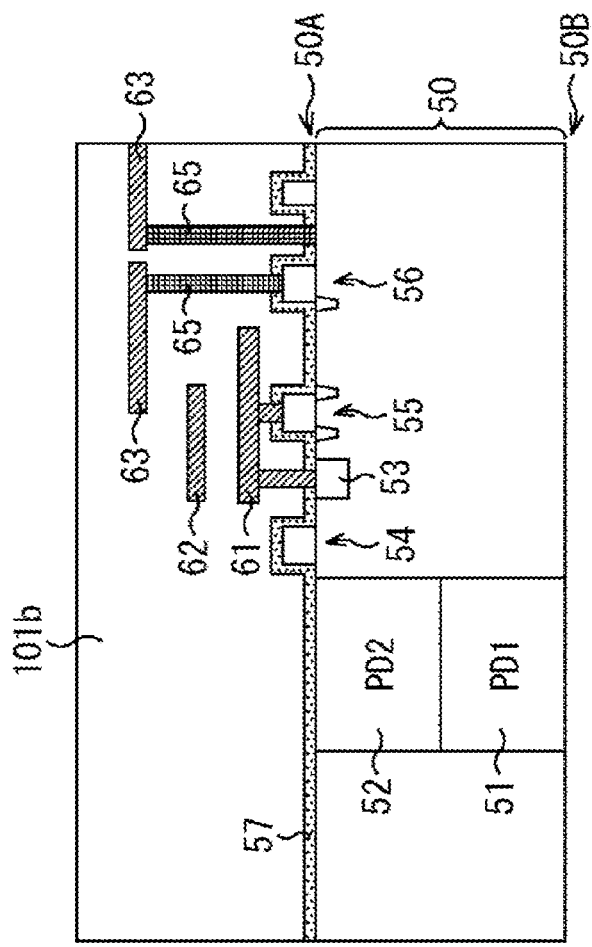
FIG. 8 is a cross-sectional view illustrating a production step of a pixel.

After that, as illustrated in FIG. 8, the wiring layer 63 is formed; thus, the multilayer wiring layer 60 is formed. The wiring layer 63 above the local wiring layer 61 is connected to the semiconductor substrate 50 by the contacts 65.

Then, a support substrate (not illustrated), another semiconductor base, or the like is bonded to the front surface 50A side of the semiconductor substrate 50 (the multilayer wiring layer 60), and the resulting structure is turned upside down.

Figure 9:
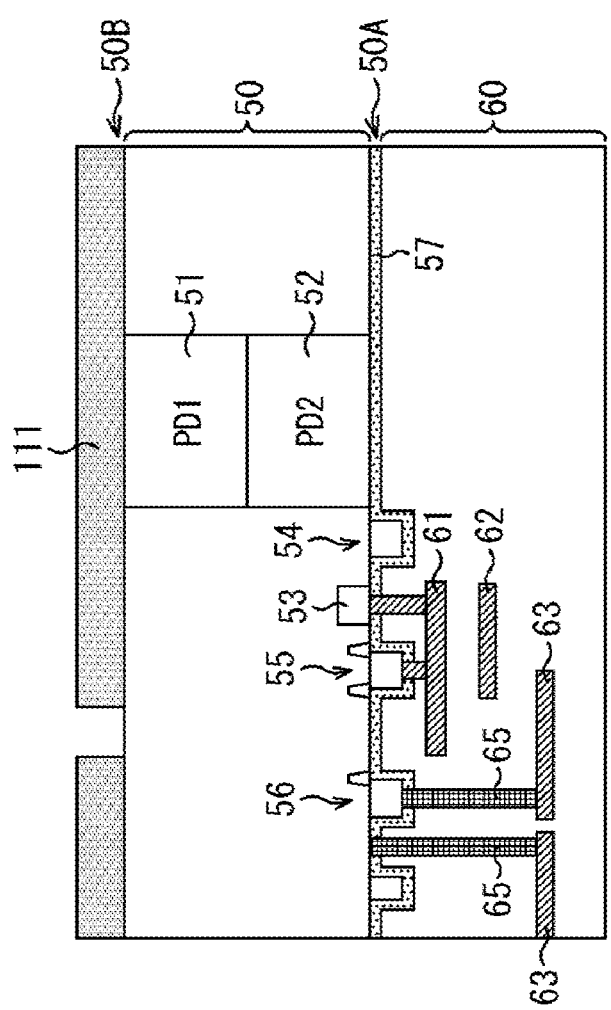
FIG. 9 is a cross-sectional view illustrating a production step of a pixel.
Figure 10:
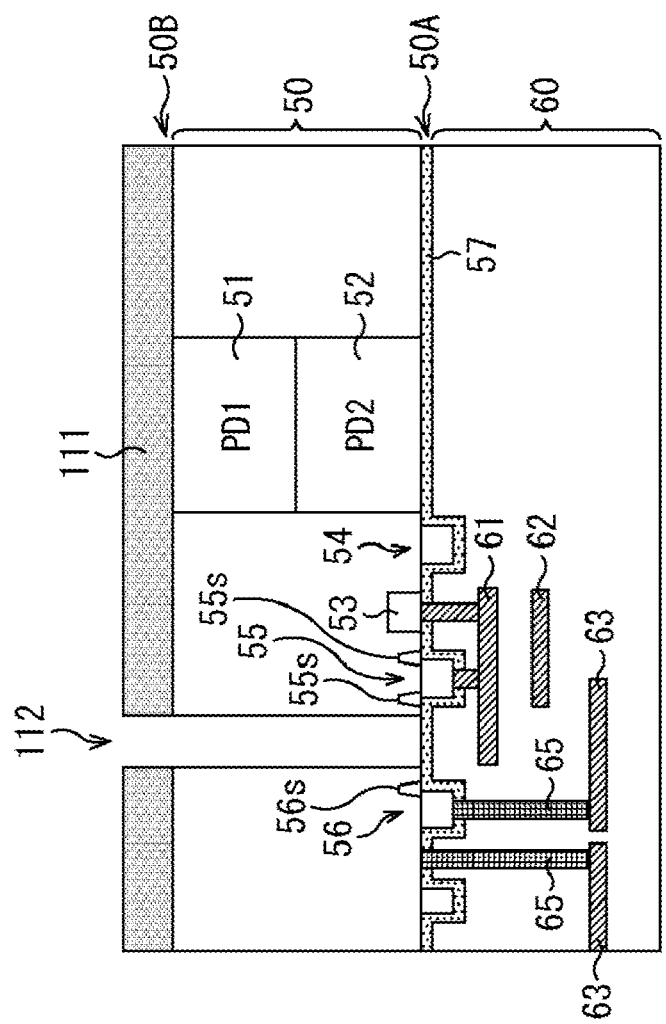
FIG. 10 is a cross-sectional view illustrating a production step of a pixel.

On the back surface 50B side of the semiconductor substrate 50, first, as illustrated in FIG. 9, a resist 111 is patterned in accordance with a position where the through electrode 58 is to be formed. After that, as illustrated in FIG. 10, Si (the semiconductor substrate 50) is processed by a technique such as dry etching; thus, a through hole 112 is formed. The etching here is stopped at the etch stop layer 57, which is formed on the front surface 50A side of the semiconductor substrate 50. In addition, even in the case where misregistration occurs in the patterning of the resist 111, the element isolation portions 55s and 56s formed on the front surface 50A side of the semiconductor substrate 50 function as etching stoppers.

Figure 11:
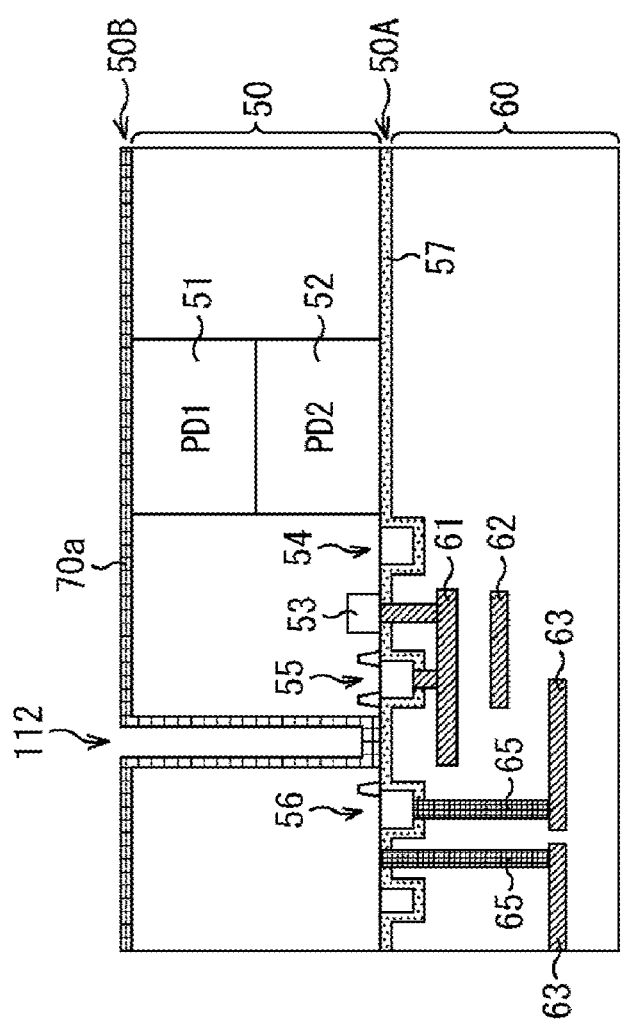
FIG. 11 is a cross-sectional view illustrating a production step of a pixel.

After the resist 111 is removed, as illustrated in FIG. 11, an oxide film or the like is formed by a technique such as atomic layer deposition (ALD) in the through hole 112; thus, an insulating film 70a is embedded.

Figure 12:
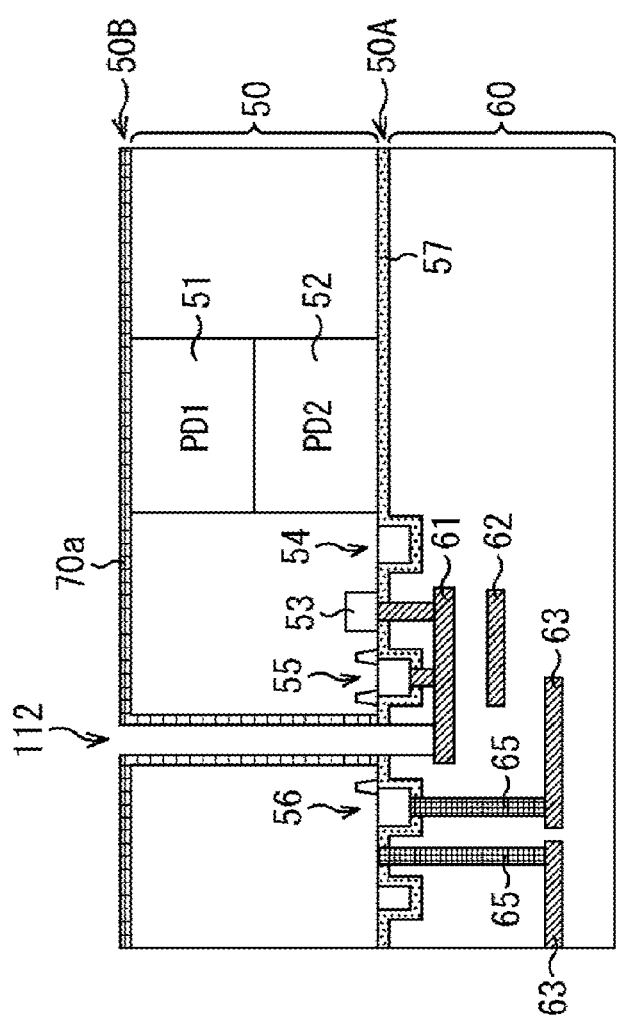
FIG. 12 is a cross-sectional view illustrating a production step of a pixel.

After that, as illustrated in FIG. 12, the insulating film 70a formed at the bottom of the through hole 112, the etch stop layer 57, and an interlayer insulating film of the multilayer wiring layer 60 are etched by a technique such as dry etching; thus, the through hole 112 reaches the local wiring layer 61. The etching here is stopped at the local wiring layer 61.

Figure 13:
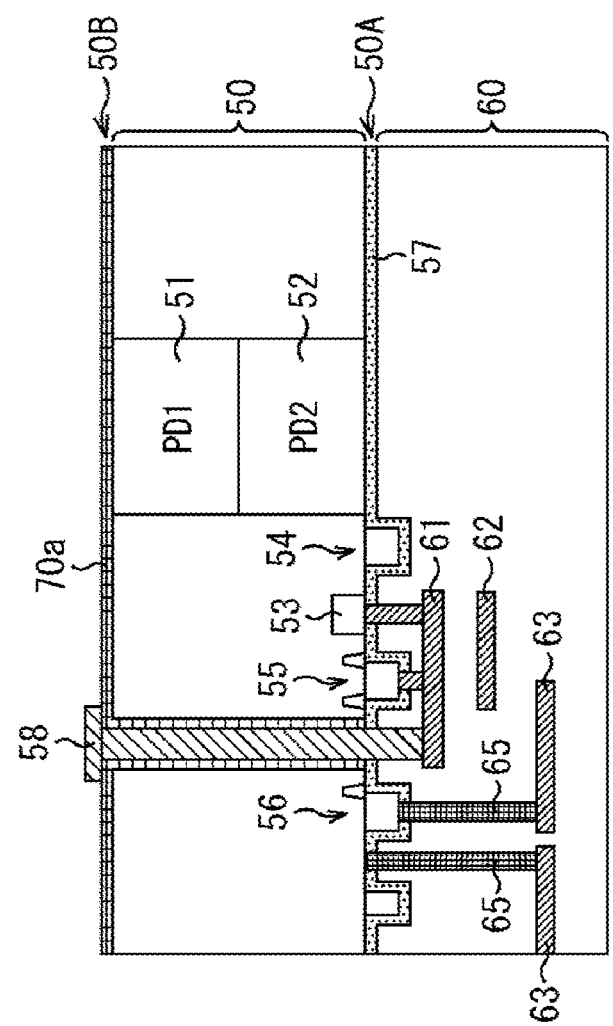
FIG. 13 is a cross-sectional view illustrating a production step of a pixel.

Subsequently, as illustrated in FIG. 13, barrier metal or the like is embedded in the through hole 112 by a technique such as ALD to form a conductive film, and W or the like is embedded by a technique such as CVD. Thus, the through electrode 58 is formed. Then, to form a lead-out wiring layer of the upper end of the through electrode 58, an unnecessary conductive film is removed by a technique such as dry etching, after patterning by photolithography.

Figure 14:
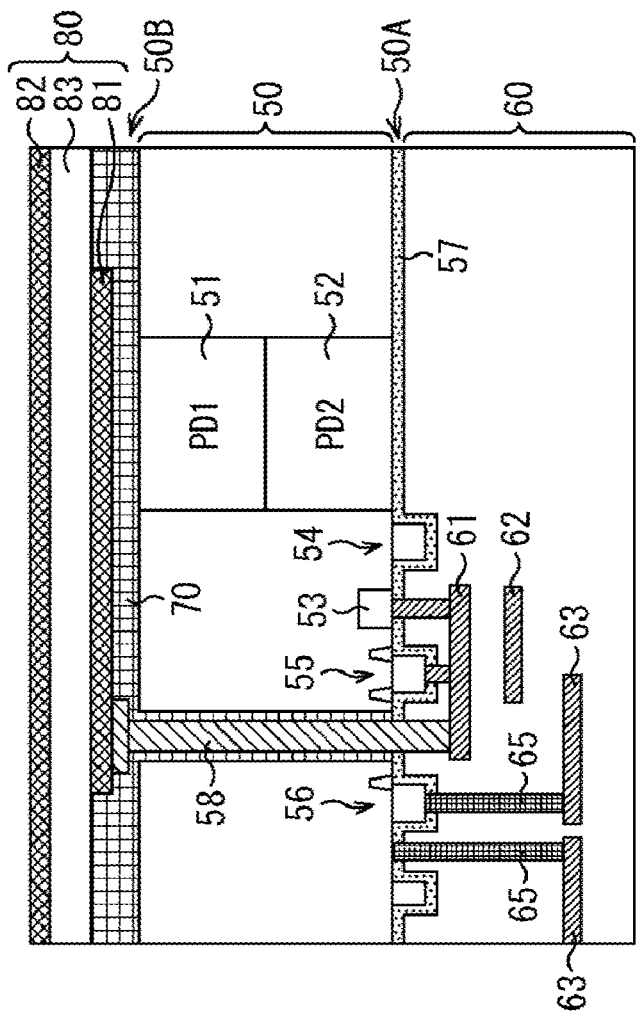
FIG. 14 is a cross-sectional view illustrating a production step of a pixel.

After that, as illustrated in FIG. 14, the insulating film 70 is formed, and then the lower electrode 81, the organic photoelectric conversion layer 83, and the upper electrode 82 are formed; thus, the organic photoelectric conversion unit 80 is formed.

Figure 15:
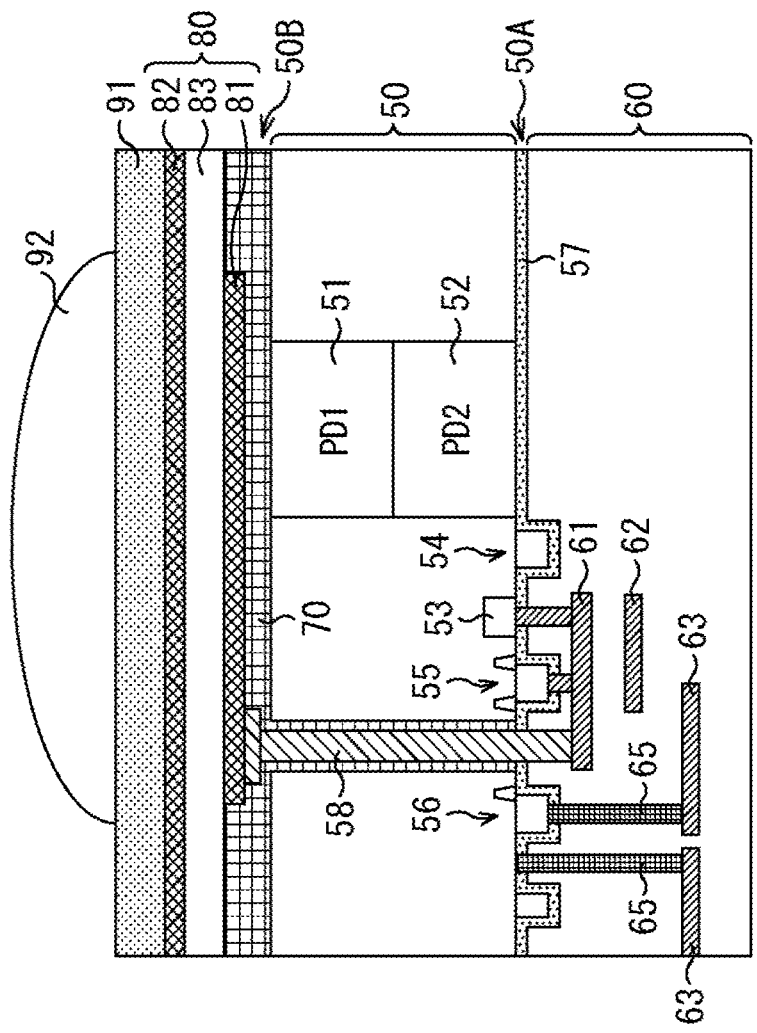
FIG. 15 is a cross-sectional view illustrating a production step of a pixel.

Then, as illustrated in FIG. 15, the passivation film 91 is formed on the upper electrode 82, and the on-chip lens 92 is formed on the passivation film 91.

Through the above steps, the pixel 20 is formed.

According to the above steps, the through electrode 58 is formed in a manner that one end of the through electrode 58 penetrates the front surface 50A of the semiconductor substrate 50 to be directly connected to the local wiring layer 61 serving as an etching stopper. This makes it possible to avoid occurrence of misalignment with a contact and an increase in contact resistance; thus, the through electrode can be made finer reliably.

In addition, in regard to the configuration disclosed in PTL 1, making a through electrode finer may lead to an increase in parasitic capacitance and contact resistance that occur in a path from an organic photoelectric conversion unit to a FD via the through electrode, resulting in worse RC delay and lower conversion efficiency.

In contrast, in the present embodiment, the local wiring layer 61 connected to the FD 53 and the amplification transistor 55 for the through electrode is in a layer separate from other wiring layers, which enhances the degree of flexibility in wiring layout and reduces parasitic capacitance. Consequently, RC delay can be improved and conversion efficiency can be enhanced.

Furthermore, a metal that is less likely to cause contamination, such as W or Ti, is used for the local wiring layer 61, and the Si substrate is processed without exposure of metal material; thus, dark characteristics and white-point characteristics due to metal contamination or the like can be kept favorable.

Moreover, in regard to existing through silicon via (TSV), stress occurs, and a transistor cannot be disposed near the TSV, which places a constraint on layout.

In contrast, in the present embodiment, the through electrode can be made finer without causing stress, which enables a layout in which a transistor is disposed near the through electrode.

Note that in the step of making the through hole 112 reach the local wiring layer 61 described with reference to FIG. 12, an etching technique called Bosch process may be used. Bosch process is an etching technique in which etching and etching sidewall protection are performed repeatedly, and enables etching with a high aspect ratio.

Figure 16:
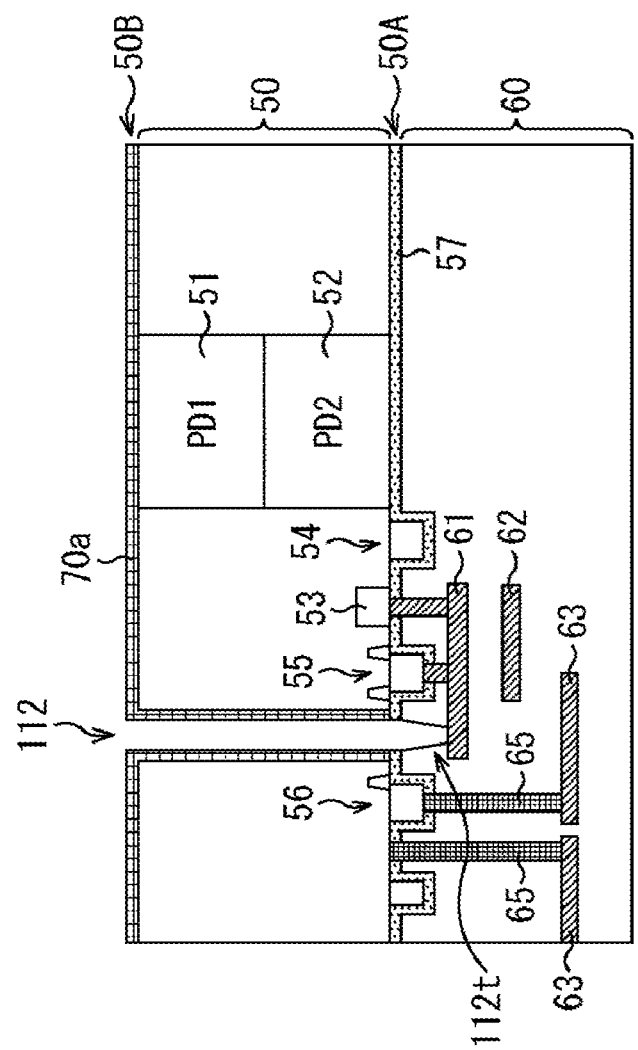
FIG. 16 is a cross-sectional view illustrating a production step of a pixel.
Figure 17:
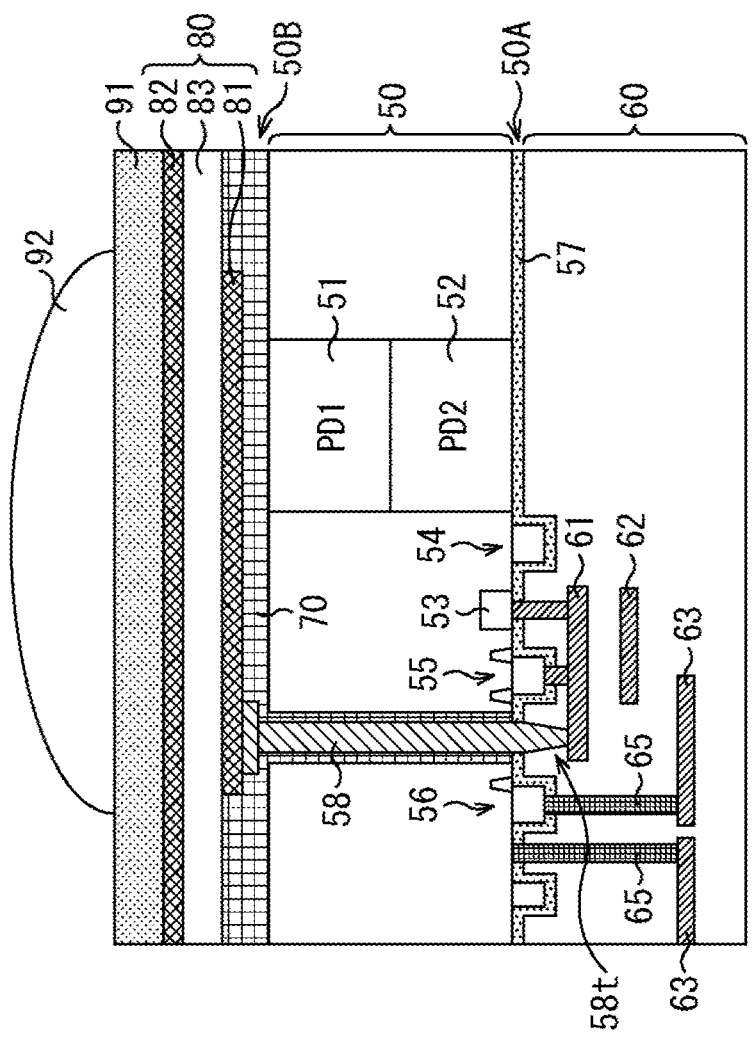
FIG. 17 is a cross-sectional view illustrating a production step of a pixel.

Through Bosch process, as illustrated in FIG. 16, a tip 112t of the through hole 112 is formed with a tapered shape. Consequently, as illustrated in FIG. 17, a tip 58t of the through electrode 58 is formed with a tapered shape. Forming the tip 58t of the through electrode 58 with a tapered shape in this manner reduces a contact area between the through electrode 58 and the local wiring layer 61, which serves as a stopper, and this enables suppression of misalignment between the through electrode 58 and the local wiring layer 61. In addition, forming the tip 58t of the through electrode 58 with a tapered shape enables a reduction in parasitic capacitance between the through electrode 58 and wiring layers constituting the multilayer wiring layer 60.

4. Second Embodiment

Figure 18:
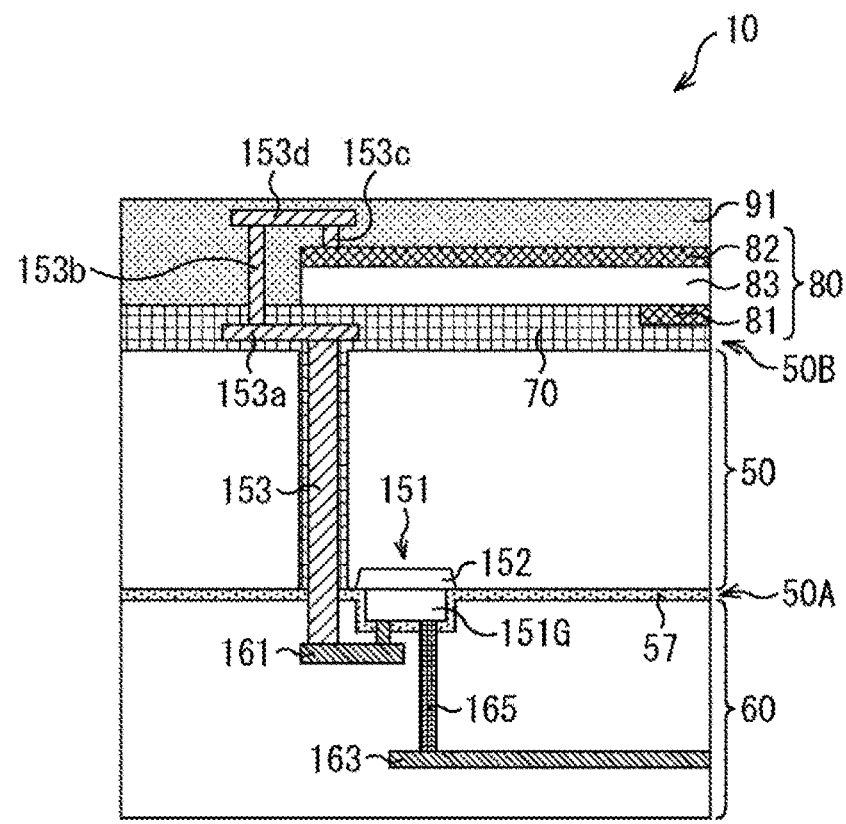
FIG. 18 is a cross-sectional view of a configuration example of a solid-state imaging device according to a second embodiment.

FIG. 18 is a cross-sectional view of the solid-state imaging device 10 according to a second embodiment of the present technology.

FIG. 18 illustrates a cross-section of part of the peripheral circuit unit 31 included in the solid-state imaging device 10.

Also in the example of FIG. 18, the multilayer wiring layer 60 is formed on the front surface 50A side of the semiconductor substrate 50, and the organic photoelectric conversion unit 80 is formed on the back surface 50B side of the semiconductor substrate 50 with the insulating film 70 therebetween, the back surface 50B serving as a light-receiving surface.

On the front surface 50A of the semiconductor substrate 50, for example, a transistor 151 is provided. A gate electrode 151G of the transistor 151 is connected to a local wiring layer 161 that is formed closest to the front surface 50A of the semiconductor substrate 50 among wiring layers 161 and 163 constituting the multilayer wiring layer 60. The gate electrode 151G of the transistor 151 is formed on an element isolation film 152. In addition, the gate electrode 151G of the transistor 151 is connected to the wiring layer 163 via a contact 165. The wiring layer 163 functions as a power supply line connected to a predetermined power source. Accordingly, the local wiring layer 161 is connected to the power supply line via the gate electrode 151G of the transistor 151.

In addition, a through electrode 153 is formed in the semiconductor substrate 50 in a manner that its lower end penetrates the front surface 50A of the semiconductor substrate 50 to be directly connected to the local wiring layer 161, and its upper end is connected to the upper electrode 82 via metal members 153a to 153d. The metal member 153a is formed as a lead-out wiring layer of the through electrode 153, and the metal members 153b and 153c are formed as contacts. The metal member 153d is formed as a wiring layer that connects the metal members 153b and 153c. The through electrode 153 and the metal members 153a to 153d are constituted by a metal material, such as W, Cu, Al, Ti, Co, Hf, or Ta. Note that in the example of FIG. 18, a tip of the through electrode 153 may be formed with a tapered shape, like the through electrode 58 in FIG. 17.

With this arrangement, a predetermined voltage is applied to the upper electrode 82, which is provided to be shared by the pixels 20.

Although voltage is constantly applied to the upper electrode 82, reliability such as withstand voltage can be kept by forming the gate electrode 151G on the element isolation film 152. In addition, in process, the gate electrode 151G may be in a floating state and be subjected to charge-up damage when the through electrode 153 and the metal members 153a to 153d are formed, but this can also be mitigated by forming the gate electrode 151G on the element isolation film 152.

5. Production Steps of Configuration in which Voltage is Applied to Upper Electrode Next, production steps of a configuration in which voltage is applied to the upper electrode 82 will be described with reference to FIGS. 19 to 23.

Note that steps up to forming the multilayer wiring layer 60 on the front surface 50A side of the semiconductor substrate 50 and forming the through electrode 153 are basically similar to the steps for forming the pixel 20, and therefore description thereof is omitted.

Figure 19:
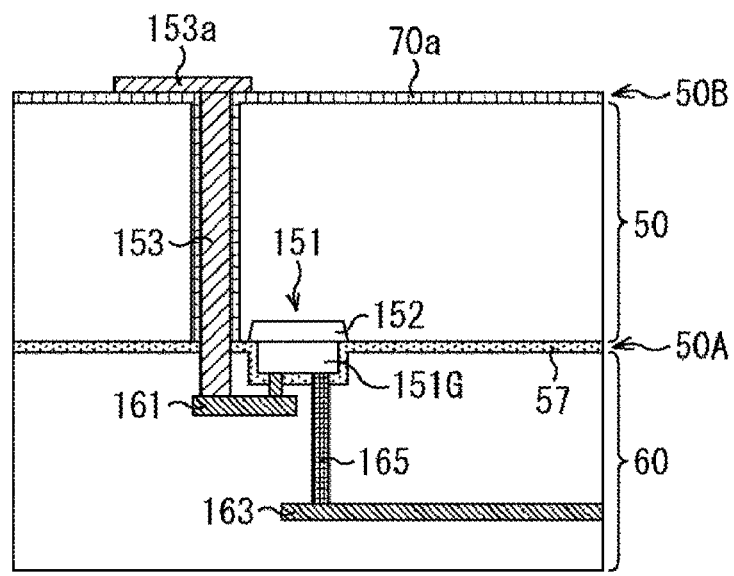
FIG. 19 is a cross-sectional view illustrating a production step of a configuration in which voltage is applied to an upper electrode.

After the formation of the through electrode 153, as illustrated in FIG. 19, to form the lead-out wiring layer 153a of the upper end of the through electrode 153, an unnecessary conductive film is removed by a technique such as dry etching, after patterning by photolithography.

Figure 20:
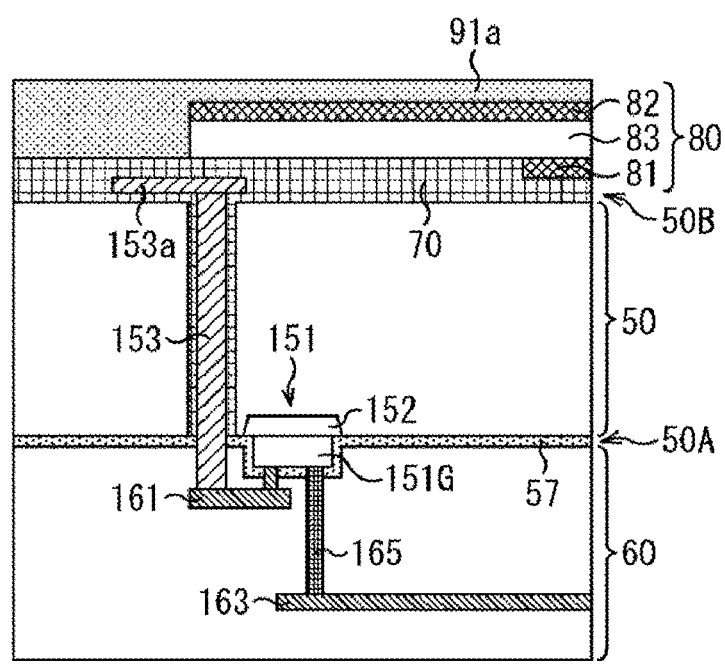
FIG. 20 is a cross-sectional view illustrating a production step of a configuration in which voltage is applied to an upper electrode.

Subsequently, as illustrated in FIG. 20, the insulating film 70 is formed, and then the lower electrode 81, the organic photoelectric conversion layer 83, and the upper electrode 82 are formed, and a passivation film 91a is formed on the upper electrode 82.

Figure 21:
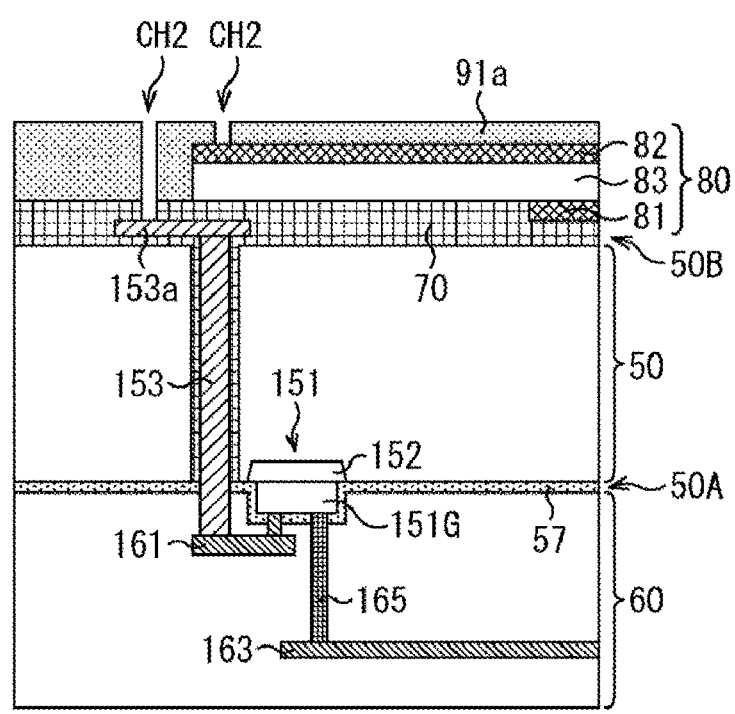
FIG. 21 is a cross-sectional view illustrating a production step of a configuration in which voltage is applied to an upper electrode.

Next, as illustrated in FIG. 21, contact holes CH2 for connecting the local wiring layer 161 to the upper electrode 82 are formed by patterning and dry etching.

Figure 22:
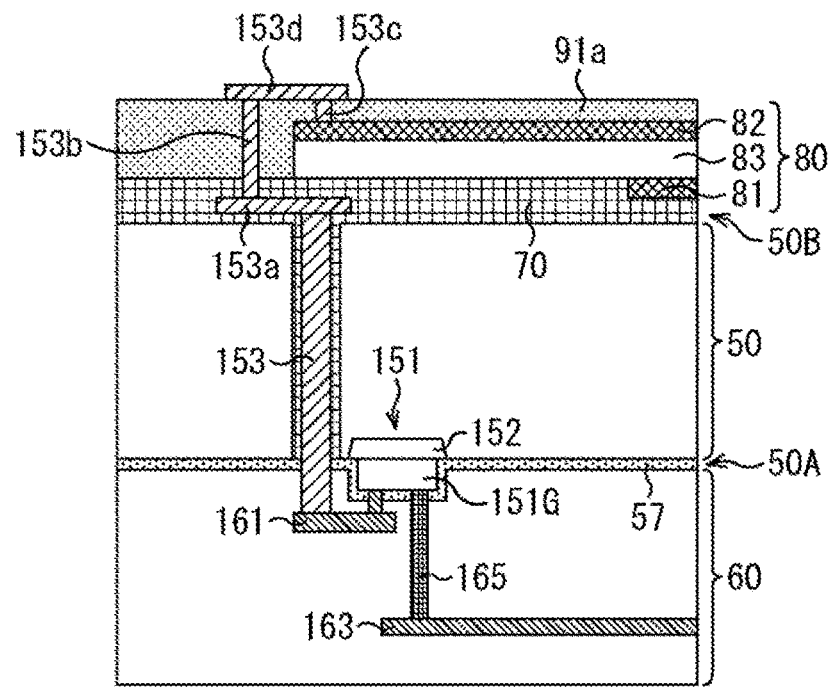
FIG. 22 is a cross-sectional view illustrating a production step of a configuration in which voltage is applied to an upper electrode.

After that, as illustrated in FIG. 22, metal is embedded in the contact holes CH2 to form the contacts 153b and 153c. For example, a Ti film or the like for work function adjustment is formed by a technique such as PVD, and barrier metal TiN, W, etc. are embedded by a technique such as CVD or PVD. After that, to form the wiring layer 153d, an unnecessary conductive film is removed by a technique such as dry etching, after patterning by photolithography.

Figure 23:
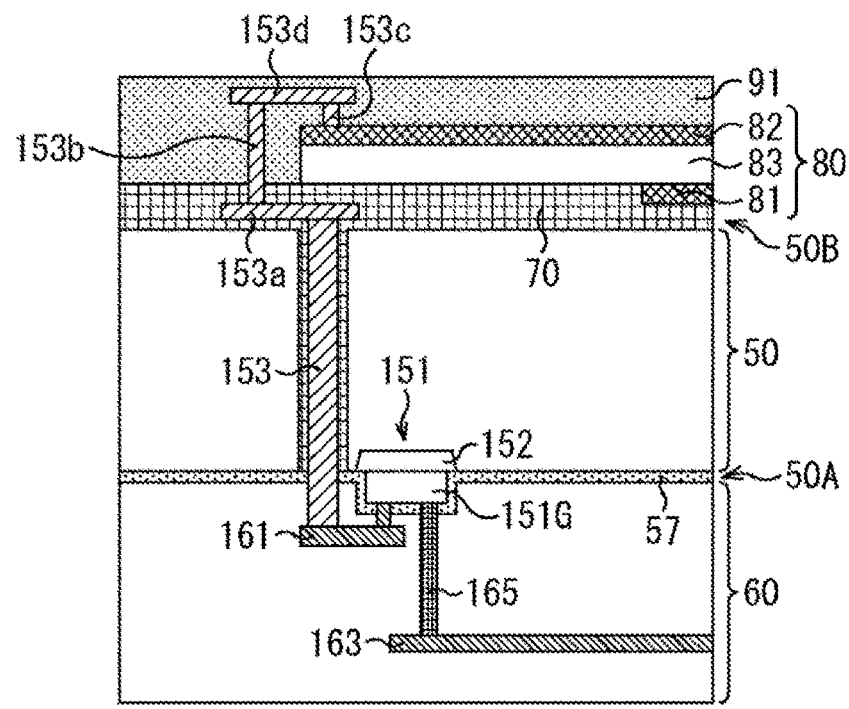
FIG. 23 is a cross-sectional view illustrating a production step of a configuration in which voltage is applied to an upper electrode.

Then, as illustrated in FIG. 23, the passivation film 91 is formed on the wiring layer 153d.

Through the above steps, the configuration in which voltage is applied to the upper electrode 82 is formed.

According to the above steps, the through electrode 153 is formed in a manner that one end of the through electrode 153 penetrates the front surface 50A of the semi-conductor substrate 50 to be directly connected to the local wiring layer 161 serving as an etching stopper. This makes it possible to avoid occurrence of misalignment with a contact and an increase in contact resistance; thus, even in the configuration in which voltage is applied to the upper electrode, the through electrode can be made finer reliably.

Figure 24:
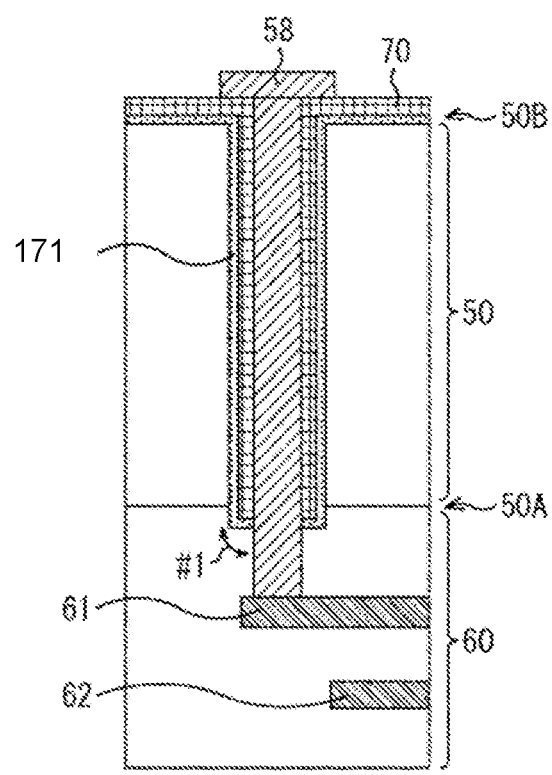
FIG. 24 is a view for describing dielectric strength of a fixed charge film.

Although description is omitted in the configurations of FIG. 2 and the like, as illustrated in FIG. 24, a fixed charge film 171 having negative fixed charge is formed between a through hole in which the through electrode 58 is formed and the insulating film 70 (70a) embedded in the through hole. This enables a reduction in dark current.

In such a configuration, when the bottom of the through hole is opened by etching, the fixed charge film 171 is exposed at a side surface of the opening portion. In the case where the through electrode 58 is formed by embedding a conductive film, for example, in this state, the through electrode 58 and the fixed charge film 171 come into contact with each other.

The fixed charge film 171 has lower dielectric strength and process resistance than the insulating film 70. Therefore, insufficient dielectric strength of the fixed charge film 171 may cause a short-circuit failure between the through electrode 58 and the fixed charge film 171 as indicated by a two-way arrow #1 in FIG. 24.

Figure 25:
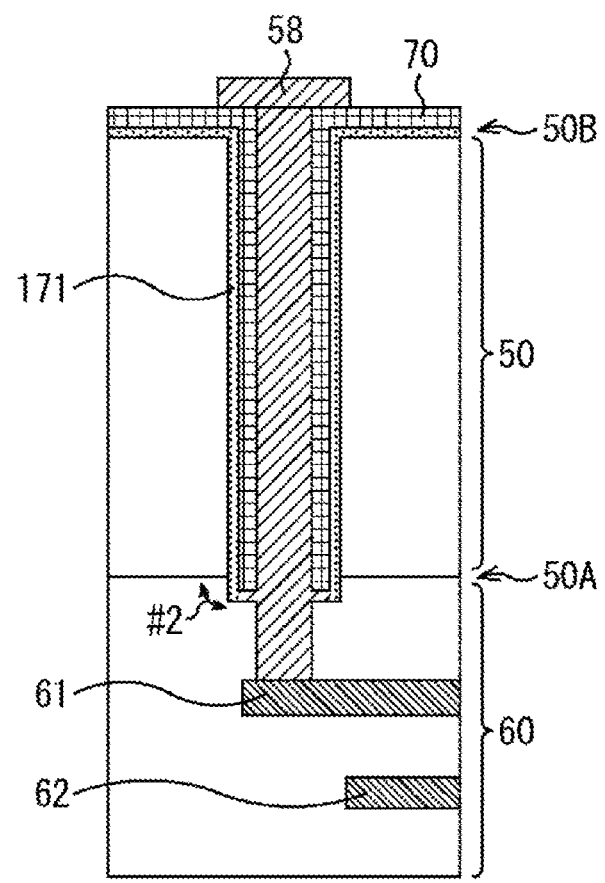
FIG. 25 is a view for describing process resistance of a fixed charge film.

Moreover, insufficient process resistance of the fixed charge film 171 causes a contact portion between the fixed charge film 171 and the through electrode 58 to recede, and a conductive film enters, as illustrated in FIG. 25. This may cause a short-circuit failure between the semiconductor substrate 50 and the through electrode 58 as indicated by a two-way arrow #2 in FIG. 25.

Hence, a configuration in which the through electrode 58 and the fixed charge film 171 are not in contact with each other is described below.

6. Third Embodiment

Figure 26:
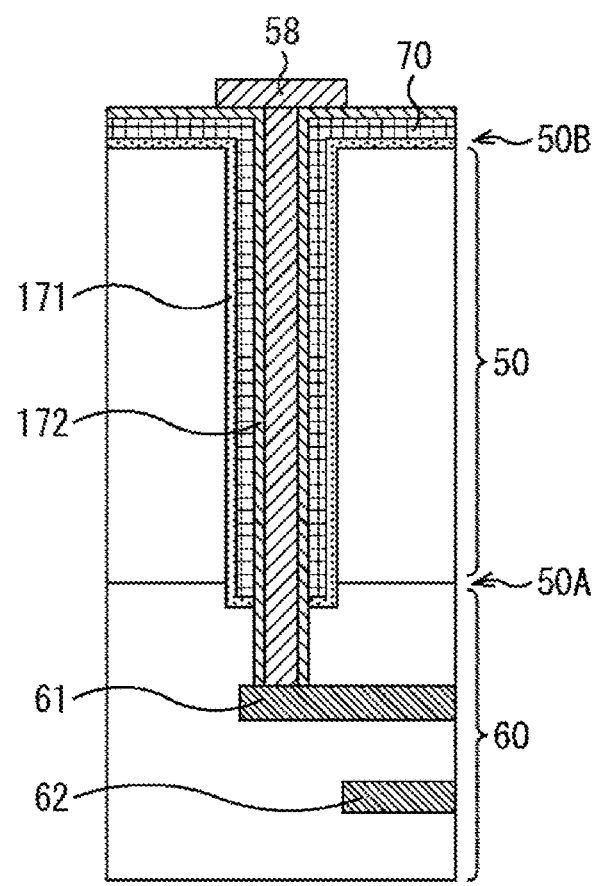
FIG. 26 is a cross-sectional view of a configuration example of a solid-state imaging device according to a third embodiment.

FIG. 26 is a cross-sectional view of the solid-state imaging device 10 according to a third embodiment of the present technology.

FIG. 26 illustrates a cross-sectional configuration around the through electrode 58 described above.

As illustrated in FIG. 26, in the through hole in which the through electrode 58 is formed, the fixed charge film 171 is formed, the insulating film 70 is formed on the fixed charge film 171, and an insulating film 172 is formed on the insulating film 70. The insulating film 172 is formed so as to prevent the through electrode 58 and the fixed charge film 171 from being in contact with each other at a side surface of an opening portion that is obtained by opening part of the bottom of the through hole on the front surface 50A side of the semiconductor substrate 50. The insulating film 172 has higher insulation properties than the fixed charge film 171.

In the example of FIG. 26, the insulating film 172 is embedded in the through hole together with the through electrode 58 so as to come into contact with the local wiring layer 61 (hereinafter simply referred to as wiring layer 61).

7. Production Steps of Configuration in which Through Electrode and Fixed Charge Film Are Not in Contact with Each Other

EXAMPLE 1

Next, examples of production steps of a configuration in which the through electrode 58 and the fixed charge film 171 are not in contact with each other will be described with reference to FIGS. 27 to 33.

Figure 27:
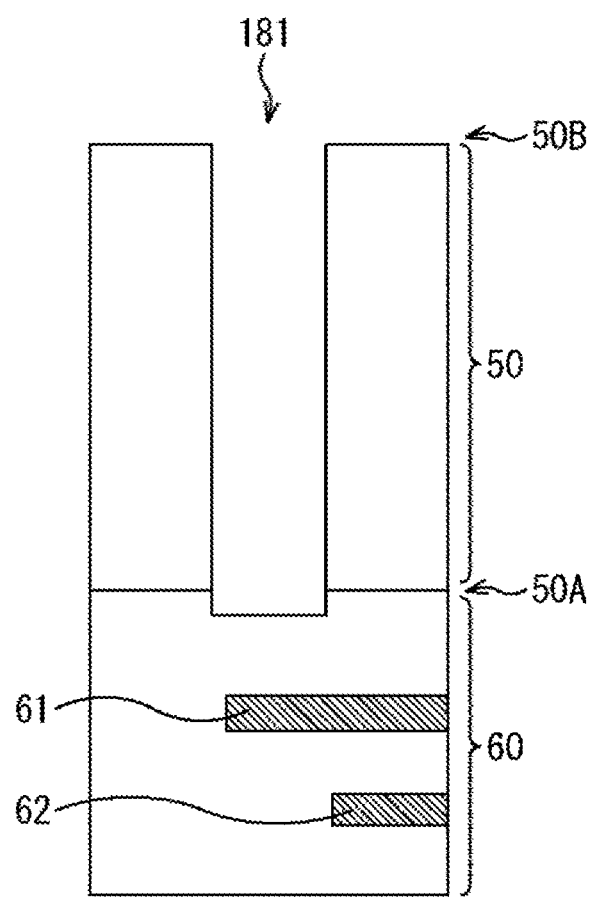
FIG. 27 is a cross-sectional view illustrating a production step of a configuration in which a through electrode and a fixed charge film are not in contact with each other.

FIG. 27 illustrates a state similar to that of FIG. 10 described above. In the step of FIG. 27, a through hole 181 is formed from the back surface 50B side of the semiconductor substrate 50 (the upper side in the drawing), in a state where the multilayer wiring layer 60 is formed on the front surface 50A side of the semiconductor substrate 50 (the lower side in the drawing).

The multilayer wiring layer 60 is formed by providing wiring layers 61 and 62 between layers of an insulating film made of $SiO_2$, SiN, SIOC, SION, or the like. The wiring layers 61 and 62 are formed of Cu, W, Al, or the like, and Ti, TiN, Ta, Tan, Ru, Co, Zr, or the like is used as their barrier metal.

The through hole 181 is formed by processing Si (the semiconductor substrate 50) by lithography and plasma etching. The etching here is performed so as to be stopped in the insulating film of the multilayer wiring layer 60. In the present embodiment, a thickness of the semiconductor substrate 50 is, for example, 1 to 50 μm, and a diameter of the through hole 181 is, for example, 100 nm to 1 μm. In addition, an aspect ratio of the etching exceeds 5, for example.

Figure 28:
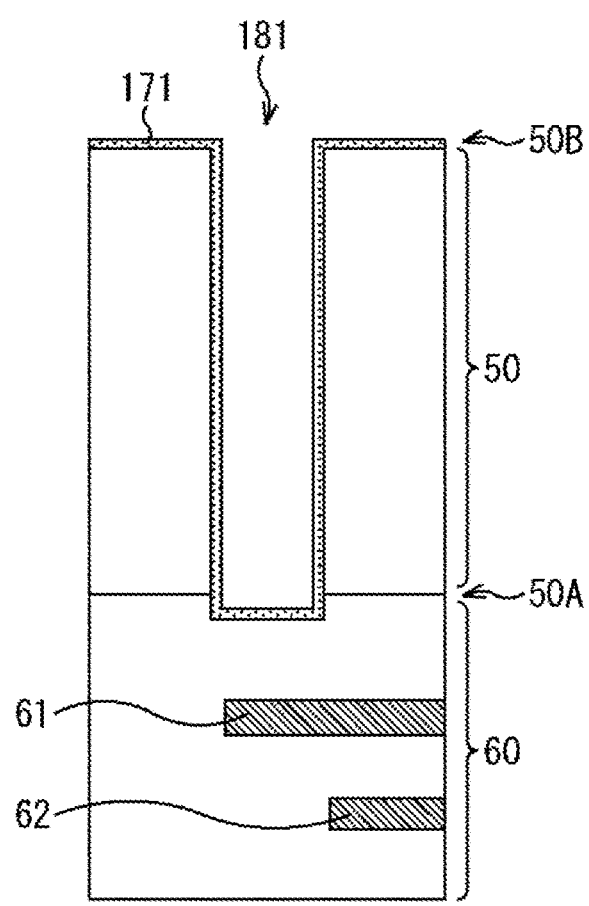
FIG. 28 is a cross-sectional view illustrating a production step of a configuration in which a through electrode and a fixed charge film are not in contact with each other.

After the formation of the through hole 181, as illustrated in FIG. 28, the fixed charge film 171 is formed by a technique such as ALD, for example, in the through hole 181. The fixed charge film 171 is formed so as to have a film thickness smaller than 50 nm, for example.

Examples of a material of the fixed charge film 171 include hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, ruthenium oxide, and yttrium oxide. As the fixed charge film 171, an aluminum nitride film, a hafnium oxynitride film, or an aluminum oxynitride film may be formed.

Figure 29:
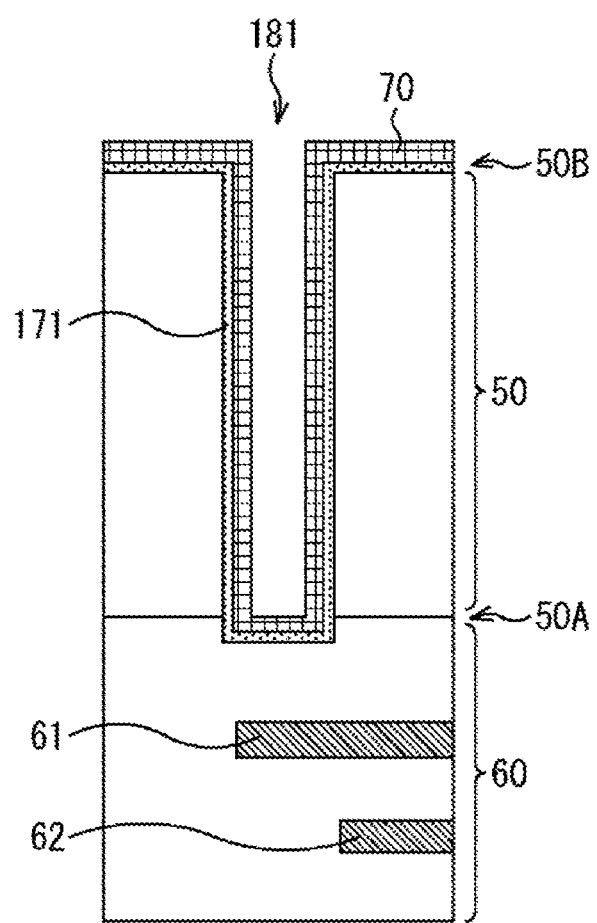
FIG. 29 is a cross-sectional view illustrating a production step of a configuration in which a through electrode and a fixed charge film are not in contact with each other.

After that, as illustrated in FIG. 29, the insulating film 70 is formed in the through hole 181 in which the fixed charge film 171 is formed. The insulating film 70 is formed by forming a film of $SiO_2$, SiN, SIOC, or the like by a technique of ALD or CVD. An inner diameter of the through hole 181 after the formation of the insulating film 70 is approximately 30 to 500 nm, for example.

Figure 30:
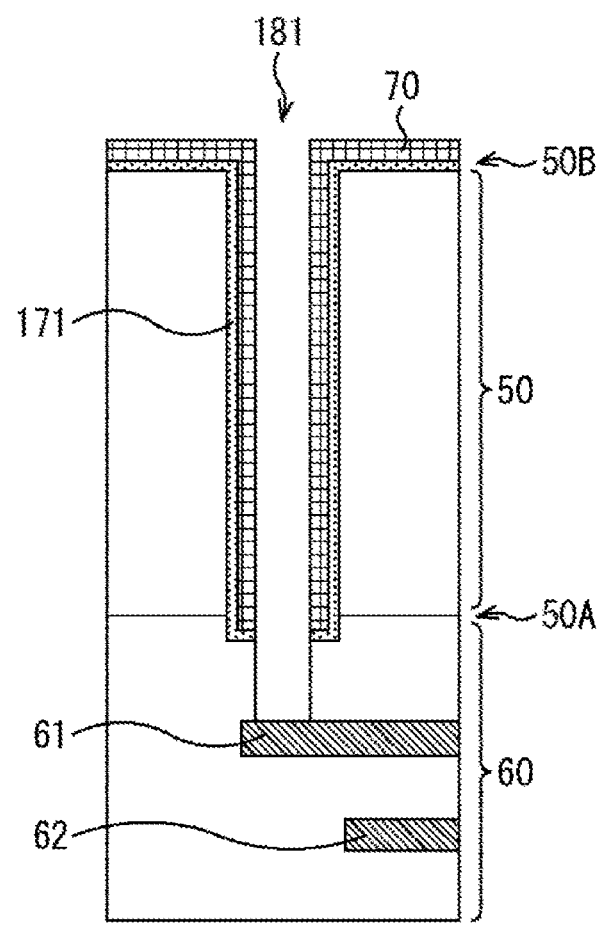
FIG. 30 is a cross-sectional view illustrating a production step of a configuration in which a through electrode and a fixed charge film are not in contact with each other.

After the formation of the insulating film 70, the insulating film 70, the fixed charge film 171, and the insulating film of the multilayer wiring layer 60 at the bottom of the through hole 181 (the front surface 50A side of the semiconductor substrate 50) are processed by plasma etching; thus, as illustrated in FIG. 30, the through hole 181 is made to reach the wiring layer 61.

Examples of an etching gas used in plasma etching include gases such as $CF_4$, $CHF_3$, $CH_2F_2$, $CH_3F$, $C_4F_8$, $C_4F_6$, $C_5HF_7$, $CH_4$, $C_2H_4$, He, Ar, $O_2$, CO, and $N_2$.

After the through hole 181 reaches the wiring layer 61, etching residues and polymers are removed by ashing or wet etching. In ashing, for example, a gas such as $O_2$, $H_2$, or $N_2$ is made into plasma to be used.

Figure 31:
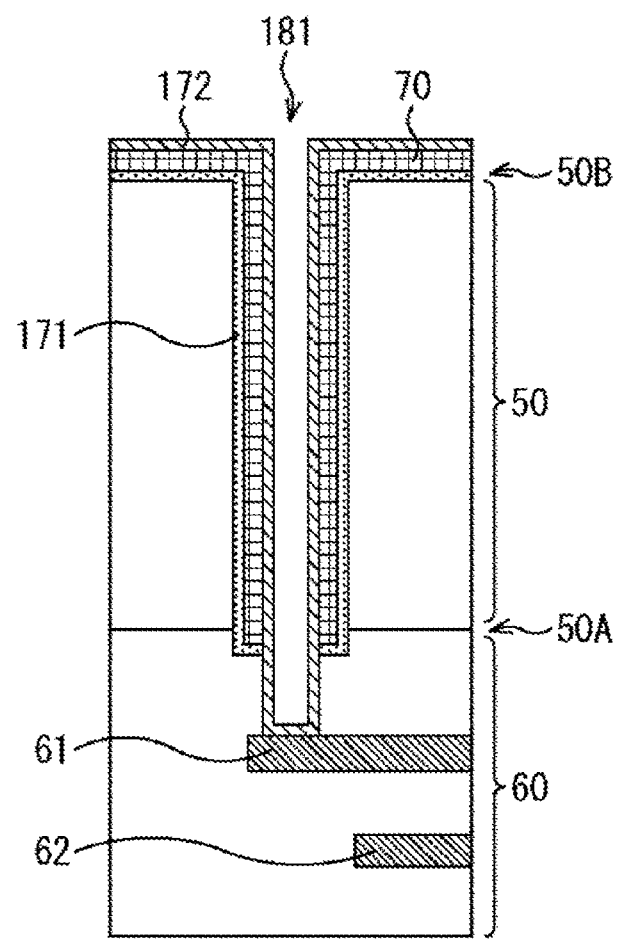
FIG. 31 is a cross-sectional view illustrating a production step of a configuration in which a through electrode and a fixed charge film are not in contact with each other.

After that, as illustrated in FIG. 31, the insulating film 172 is formed in the through hole 181 that has reached the wiring layer 61. The insulating film 172 is formed by forming a film of $SiO_2$, SiN, SIOC, or the like by a technique of ALD. The insulating film 172 is formed so as to have a film thickness of 5 nm or more, for example.

Figure 32:
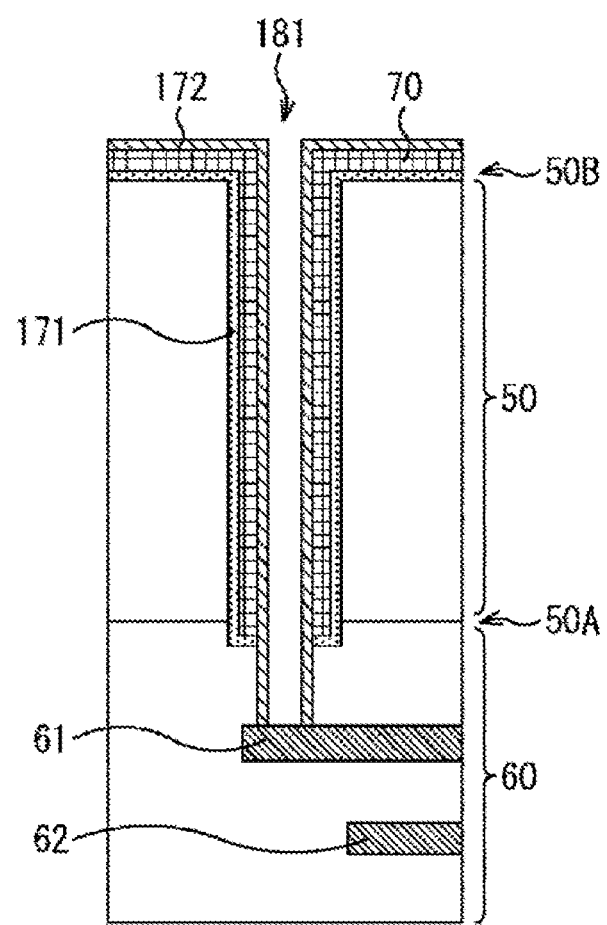
FIG. 32 is a cross-sectional view illustrating a production step of a configuration in which a through electrode and a fixed charge film are not in contact with each other.

After the formation of the insulating film 172, as illustrated in FIG. 32, the insulating film 172 at the bottom of the through hole 181 (the front surface 50A side of the semiconductor substrate 50) is processed by plasma etching; thus, the through hole 181 reaches the wiring layer 61 again. An etching gas similar to that in the step of FIG. 29 is used here as well.

After the through hole 181 reaches the wiring layer 61, etching residues and polymers are removed by ashing or wet etching.

Figure 33:
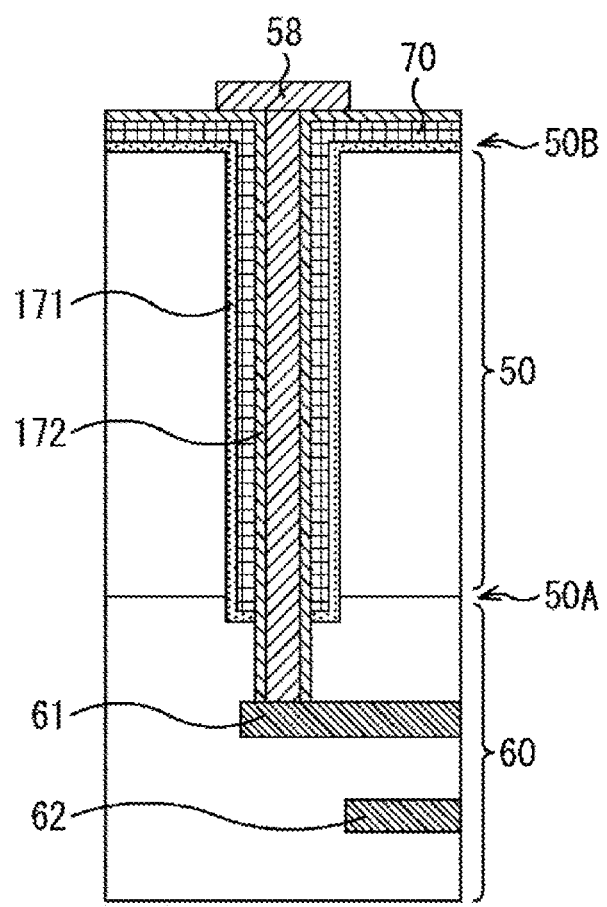
FIG. 33 is a cross-sectional view illustrating a production step of a configuration in which a through electrode and a fixed charge film are not in contact with each other.

After that, in the through hole 181, barrier metal is formed by a technique such as CVD, PVD, or ALD, and subsequently a conductive film is formed. Ti, TiN, Ta, TaN, Ru, Co, Zr, or the like is used as the barrier metal, and the conductive film is formed by Cu plating. As the conductive film, a film of W or Al may be formed by a technique such as CVD, PVD, or ALD. In this manner, as illustrated in FIG. 33, the through electrode 58 is formed in the through hole 181.

Through the above steps, the insulating film 172 is formed so as to prevent contact between the through electrode 58 and the fixed charge film 171; thus, dielectric strength (withstand voltage) of the fixed charge film 171 can be enhanced, which makes it possible to suppress a short-circuit failure between the through electrode 58 and the fixed charge film 171.

In addition, since the fixed charge film 171 can be selected regardless of dielectric strength of the fixed charge film 171, a high noise reduction effect can be obtained.

Furthermore, the inner diameter of the through hole 181 can be made smaller than 1 µm by performing formation of an insulating film twice, and consequently, the through electrode 58 can be made finer.

EXAMPLE 2

Figure 34:
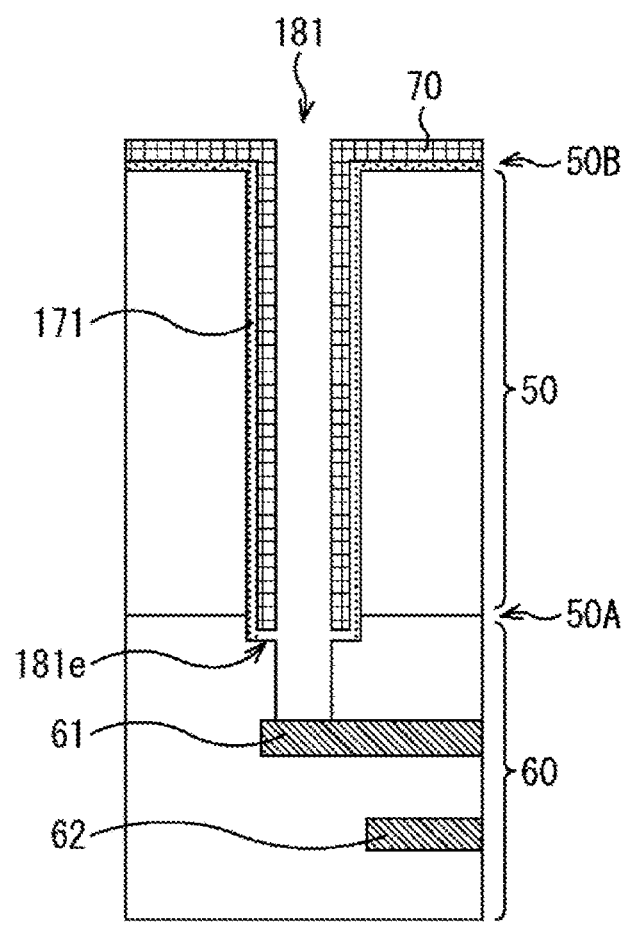
FIG. 34 is a cross-sectional view illustrating a production step of a configuration in which a through electrode and a fixed charge film are not in contact with each other.

In the step of FIG. 30 described above, when the through hole 181 is made to reach the wiring layer 61, performing etching using dilute hydrofluoric acid cleaning, for example, causes the fixed charge film 171 to recede by being etched in a lateral direction, and a groove 181e is formed, as illustrated in FIG. 34.

Figure 35:
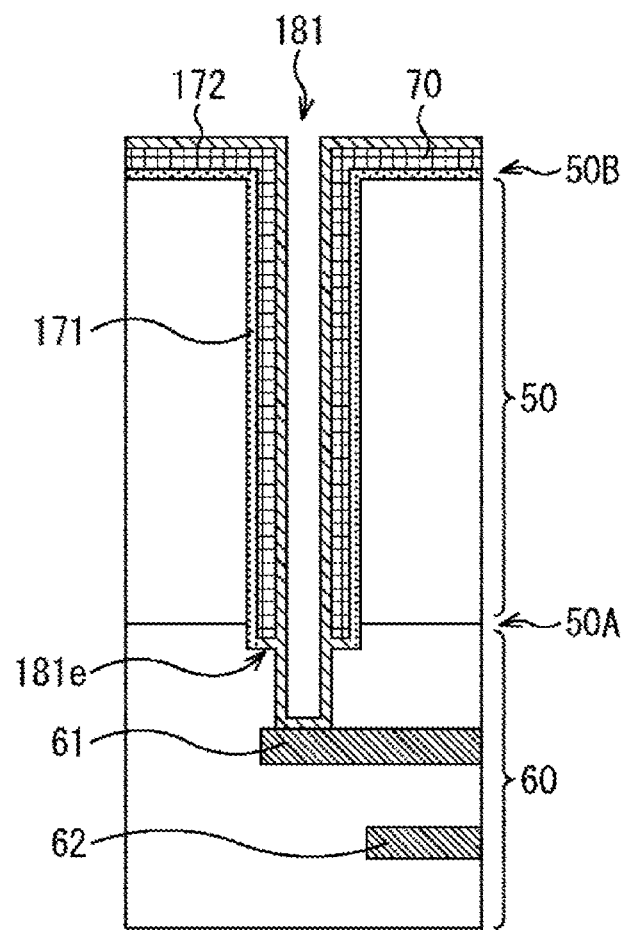
FIG. 35 is a cross-sectional view illustrating a production step of a configuration in which a through electrode and a fixed charge film are not in contact with each other.

After that, as illustrated in FIG. 35, the insulating film 172 is formed in the through hole 181 that has reached the wiring layer 61 by a technique of ALD; thus, the insulating film 172 is formed also in the groove 181e.

Figure 36:
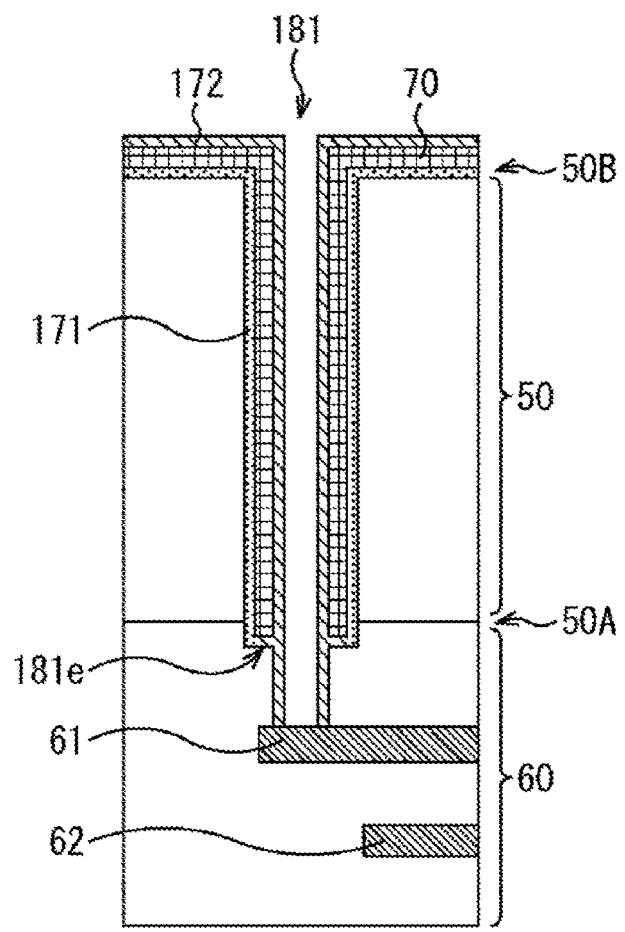
FIG. 36 is a cross-sectional view illustrating a production step of a configuration in which a through electrode and a fixed charge film are not in contact with each other.

After the formation of the insulating film 172, as illustrated in FIG. 36, the insulating film 172 at the bottom of the through hole 181 is processed by plasma etching; thus, the through hole 181 reaches the wiring layer 61.

Figure 37:
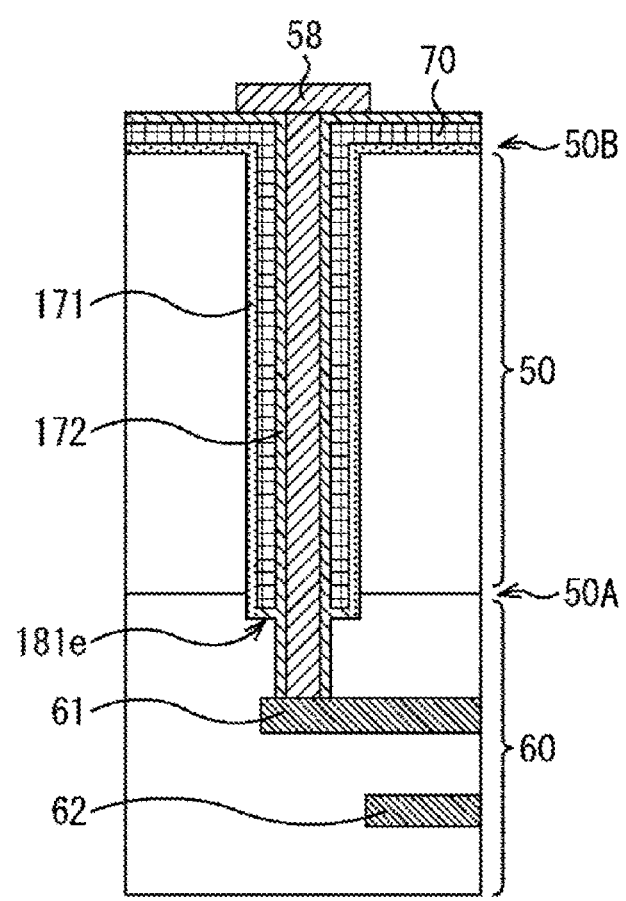
FIG. 37 is a cross-sectional view illustrating a production step of a configuration in which a through electrode and a fixed charge film are not in contact with each other.

After that, in the through hole 181, barrier metal is formed, and subsequently a conductive film is formed; thus, as illustrated in FIG. 37, the through electrode 58 is formed in the through hole 181.

Through the above steps, even in the case where insufficient process resistance of the fixed charge film 171 causes a contact portion between the fixed charge film 171 and the through electrode 58 to recede, the insulating film 172 is formed so as to fill the portion from which the contact portion has receded. This makes it possible to suppress a short-circuit failure between the semiconductor substrate 50 and the through electrode 58 due to insufficient process resistance of the fixed charge film 171.

In addition, since the fixed charge film 171 can be selected regardless of process resistance of the fixed charge film 171, a high noise reduction effect can be obtained.

EXAMPLE 3

Figure 38:
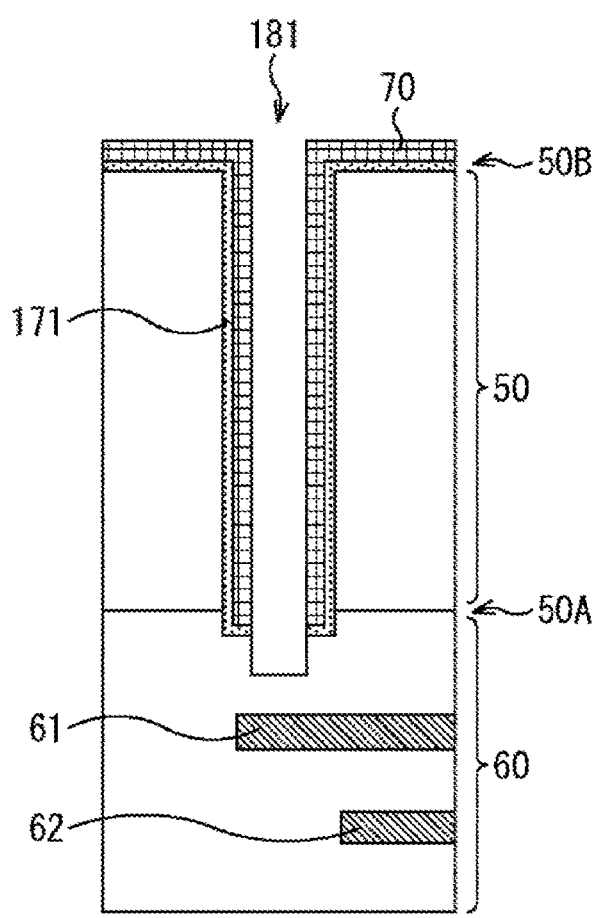
FIG. 38 is a cross-sectional view illustrating a production step of a configuration in which a through electrode and a fixed charge film are not in contact with each other.

In the step of FIG. 30 described above, the through hole 181 is made to reach the wiring layer 61 by plasma etching, but as illustrated in FIG. 38, processing may be stopped before reaching the wiring layer 61.

Figure 39:
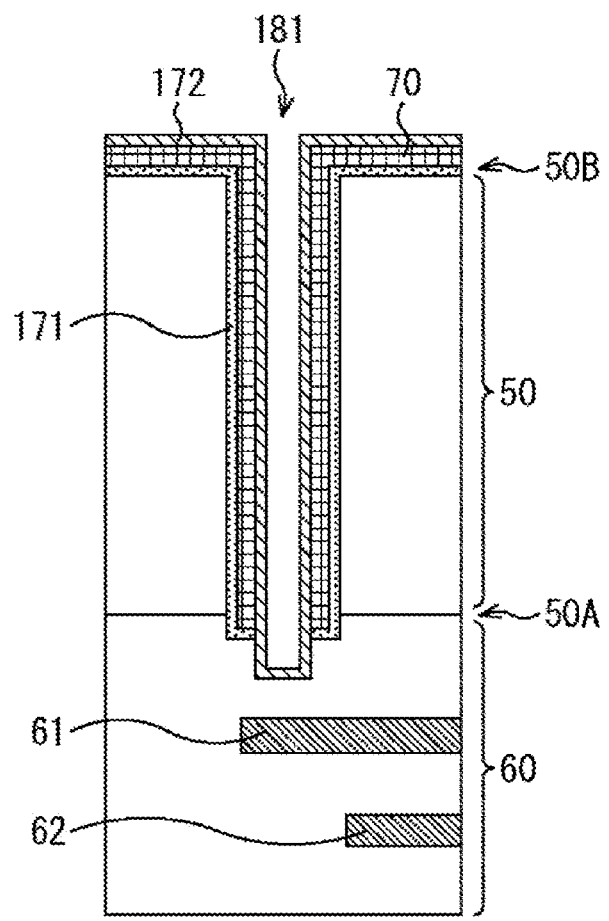
FIG. 39 is a cross-sectional view illustrating a production step of a configuration in which a through electrode and a fixed charge film are not in contact with each other.

After that, as illustrated in FIG. 39, the insulating film 172 is formed in the through hole 181 opened partway in the multilayer wiring layer 60.

Figure 40:
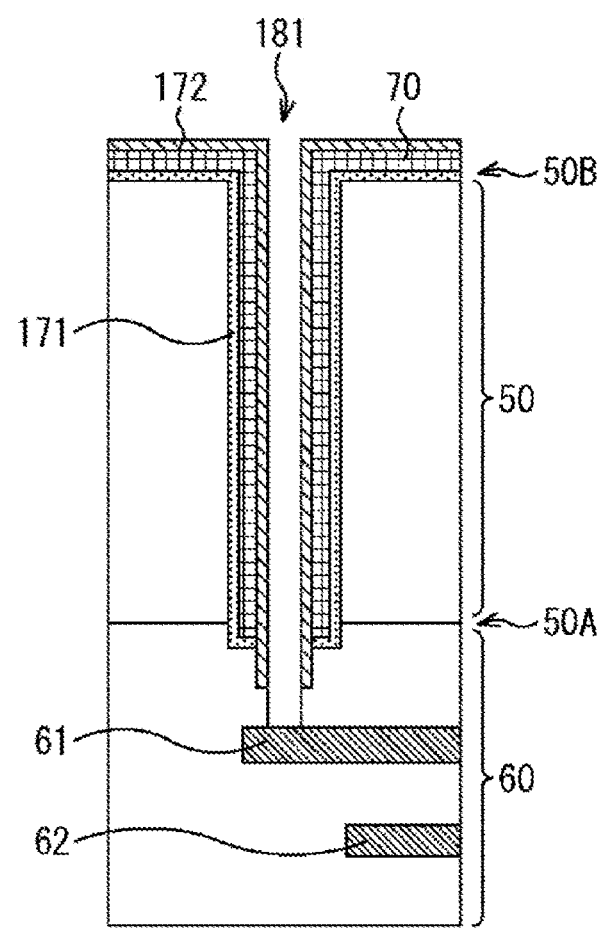
FIG. 40 is a cross-sectional view illustrating a production step of a configuration in which a through electrode and a fixed charge film are not in contact with each other.

After the formation of the insulating film 172, as illustrated in FIG. 40, the insulating film 172 at the bottom of the through hole 181 is processed by plasma etching; thus, the through hole 181 reaches the wiring layer 61.

Figure 41:
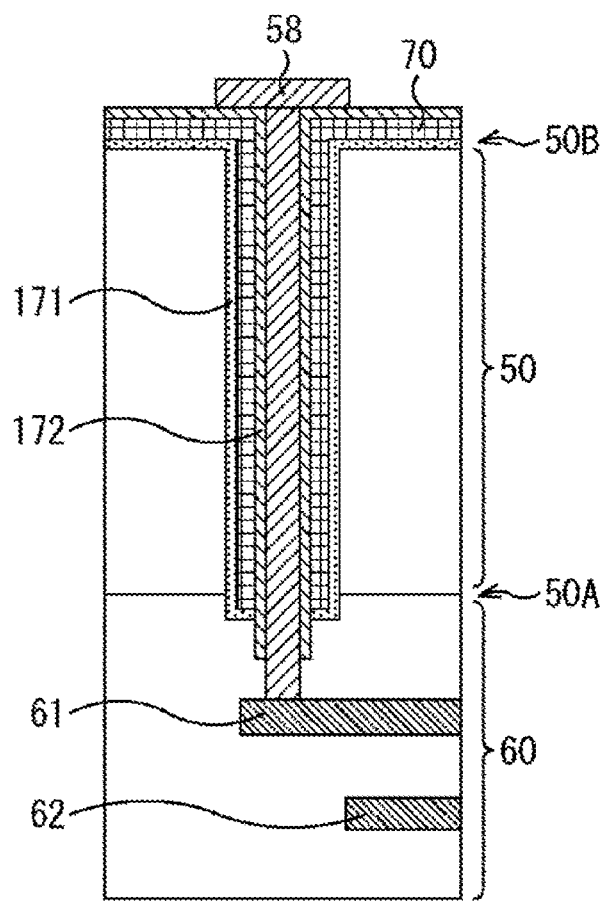
FIG. 41 is a cross-sectional view illustrating a production step of a configuration in which a through electrode and a fixed charge film are not in contact with each other.

After that, in the through hole 181, barrier metal is formed, and subsequently a conductive film is formed; thus, as illustrated in FIG. 41, the through electrode 58 is formed in the through hole 181.

Through the above steps, charging damage at the time of exposure of the wiring layer 61 by plasma etching can be reduced, and the possibility of wiring formation being inhibited by a metal-containing reaction product can be lowered.

EXAMPLE 4

Figure 42:
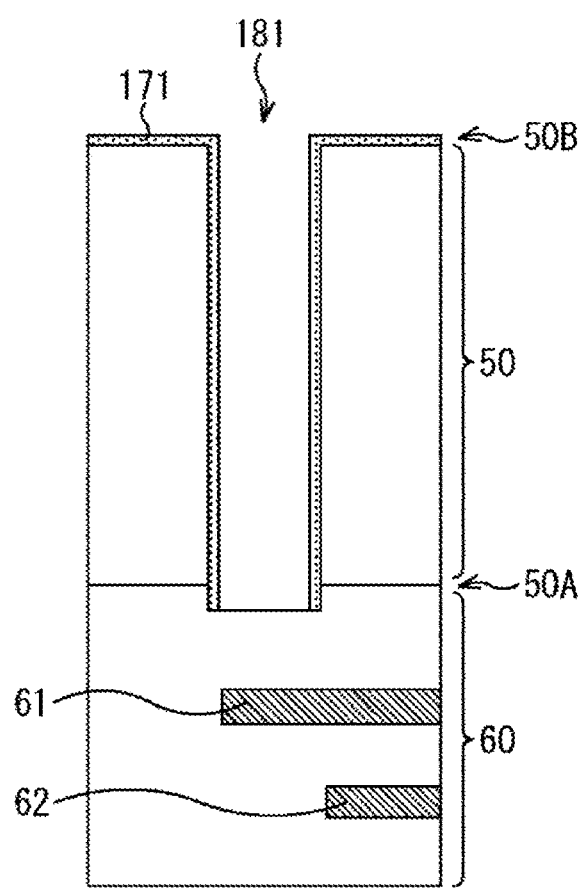
FIG. 42 is a cross-sectional view illustrating a production step of a configuration in which a through electrode and a fixed charge film are not in contact with each other.

After the step of FIG. 28 described above, in the step of FIG. 29, the insulating film 70 is formed in the through hole 181 in which the fixed charge film 171 is formed. Without being limited to this, after the formation of the fixed charge film 171 in the through hole 181 (the step of FIG. 28), the fixed charge film 171 at the bottom of the through hole 181 may be removed by plasma etching, as illustrated in FIG. 42.

Figure 43:
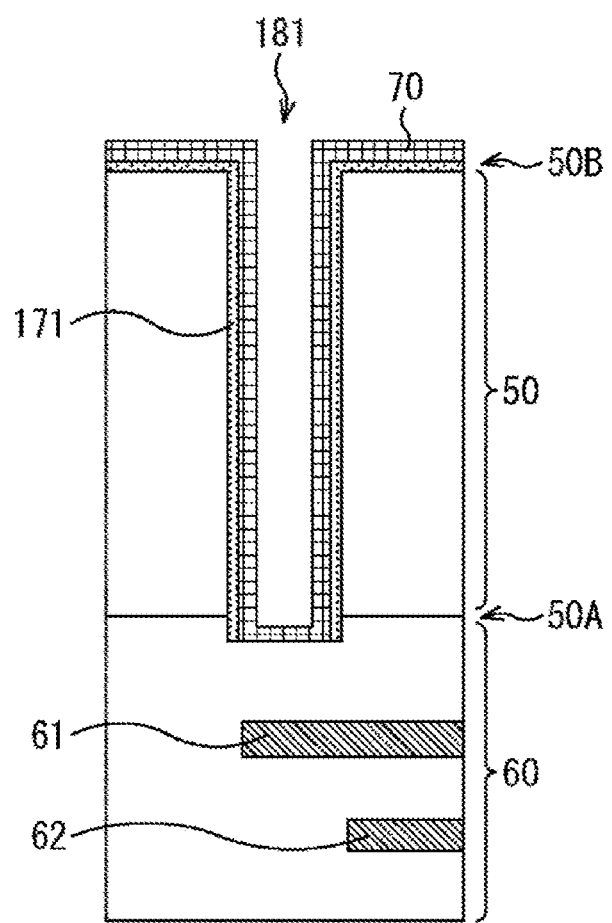
FIG. 43 is a cross-sectional view illustrating a production step of a configuration in which a through electrode and a fixed charge film are not in contact with each other.

After that, as illustrated in FIG. 43, the insulating film 70 is formed in the through hole 181 from which the fixed charge film 171 at the bottom has been removed.

Figure 44:
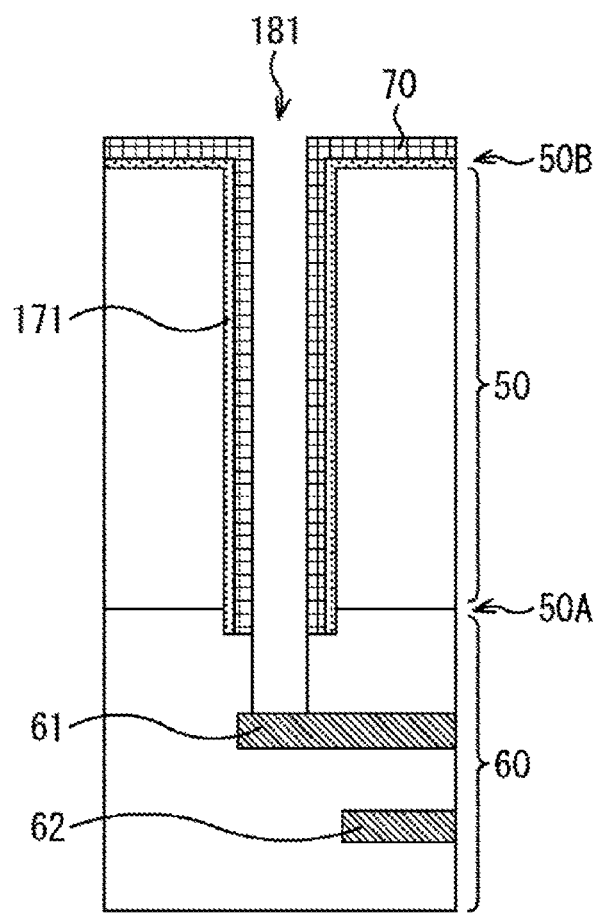
FIG. 44 is a cross-sectional view illustrating a production step of a configuration in which a through electrode and a fixed charge film are not in contact with each other.

After the formation of the insulating film 70, the insulating film 70 and the insulating film of the multilayer wiring layer 60 at the bottom of the through hole 181 are processed by plasma etching; thus, as illustrated in FIG. 44, the through hole 181 reaches the wiring layer 61.

Figure 45:
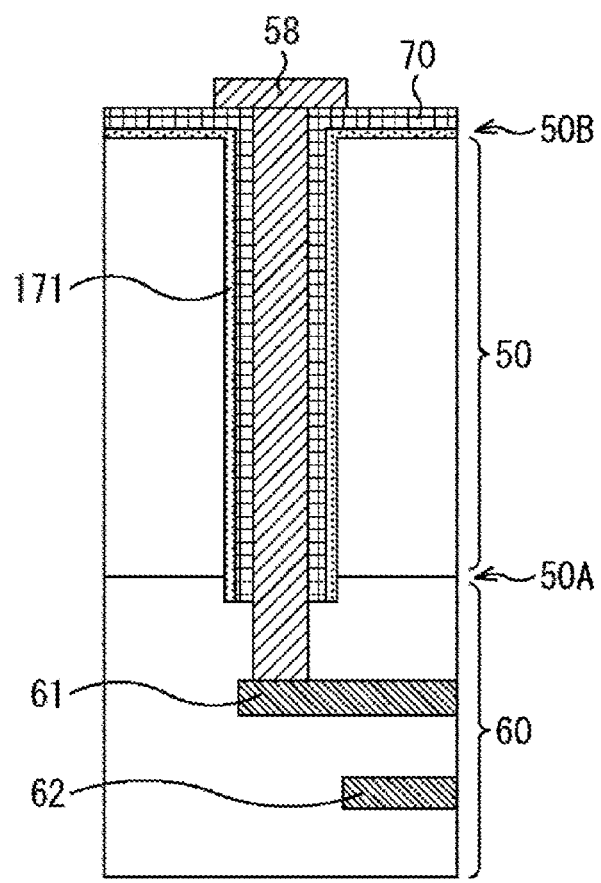
FIG. 45 is a cross-sectional view illustrating a production step of a configuration in which a through electrode and a fixed charge film are not in contact with each other.

After that, in the through hole 181, barrier metal is formed, and subsequently a conductive film is formed; thus, as illustrated in FIG. 45, the through electrode 58 is formed in the through hole 181.

That is, the insulating film 70 is formed so as to prevent the through electrode 58 and the fixed charge film 171 from being in contact with each other at a side surface of an opening portion that is obtained by opening the bottom of the through hole 181 on the front surface 50A side of the semiconductor substrate 50.

Through the above steps, a configuration in which the through electrode 58 and the fixed charge film 171 are not in contact with each other can be achieved with reduced steps, without forming the insulating film 172, though this example is limited to a case where the fixed charge film 171 has process resistance.

EXAMPLE 5

Figure 46:
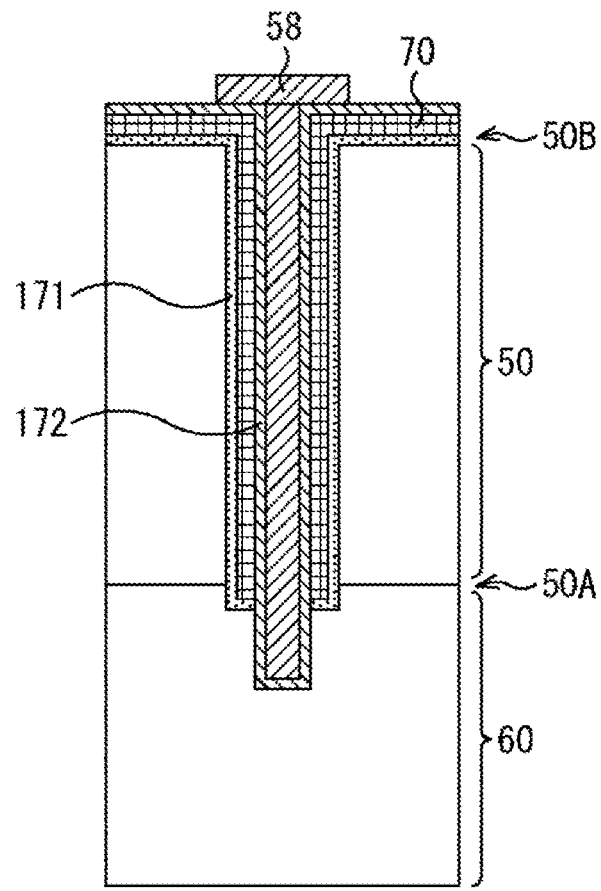
FIG. 46 is a cross-sectional view of a configuration example in which a through electrode and a wiring layer are not in contact with each other.

The above description is given on a structure in which the through electrode 58 is in contact with a wiring layer in the multilayer wiring layer 60, but as illustrated in FIG. 46, a structure in which the through electrode 58 is not in contact with a wiring layer in the multilayer wiring layer 60 may be employed.

In this case, in the step of FIG. 32 described above, there is no need to process the insulating film 172 at the bottom of the through hole 181.

The structure of the present embodiment can be applied to, as well as a through electrode, every structure in which a conductive film is embedded in Si (semiconductor substrate), noise occurring on a Si surface is suppressed, and different voltages are applied between the conductive film and Si.

Figure 47:
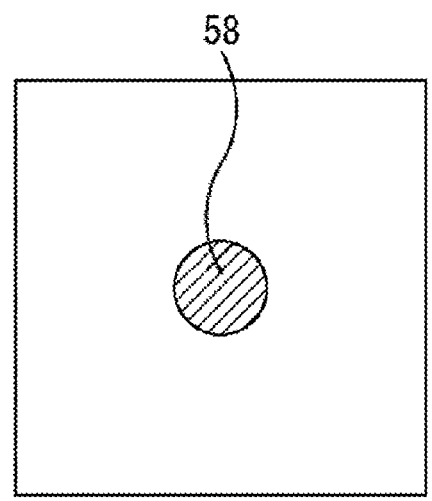
FIG. 47 illustrates an example of a pattern of a conductive film.
Figure 48:
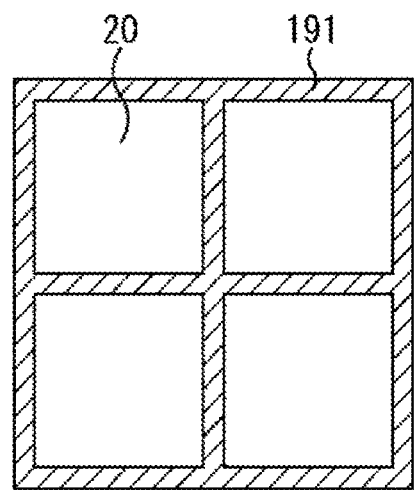
FIG. 48 illustrates an example of a pattern of a conductive film.

Furthermore, a pattern of a conductive film is not limited to a circular shape like that of the through electrode 58 in the top view of FIG. 47, for example, and a trench may be formed. For example, as illustrated in FIG. 48, a light blocking structure 191 that blocks light between the pixels 20 may be employed as a pattern of a conductive film.

Incidentally, the through electrode is formed from the back surface 50B side of the semiconductor substrate 50 in the above embodiments, but can also be formed from the front surface 50A side of the semiconductor substrate 50.

Hence, a configuration in which a through electrode is formed from the front surface 50A side of the semiconductor substrate 50 is described below.

8. Fourth Embodiment

Figure 49:
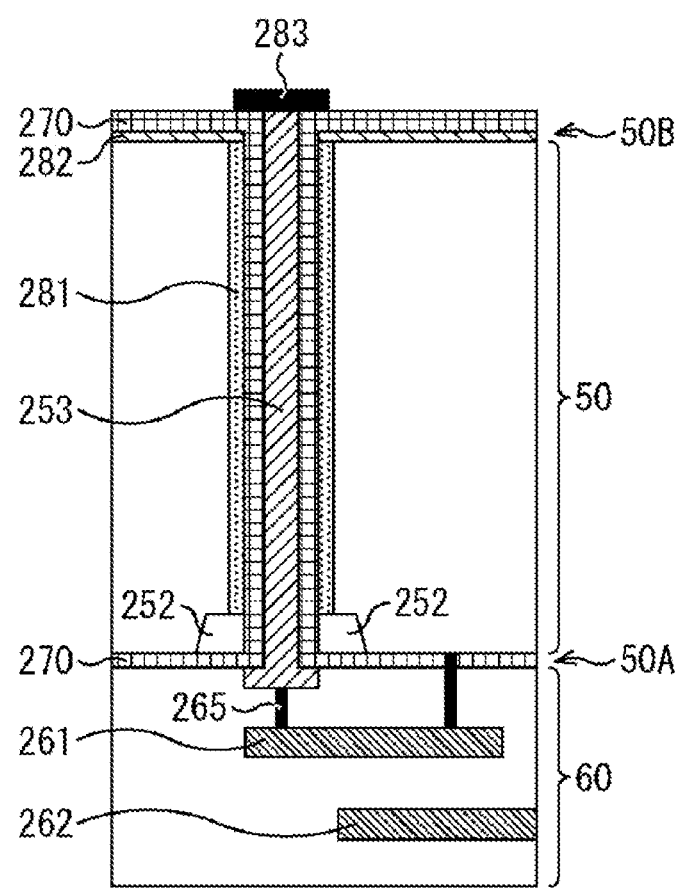
FIG. 49 is a cross-sectional view of a configuration example of a solid-state imaging device according to a fourth embodiment.

FIG. 49 is a cross-sectional view of the solid-state imaging device 10 according to a fourth embodiment of the present technology.

FIG. 49 illustrates a cross-sectional configuration around a through electrode.

Also in the example of FIG. 49, the multilayer wiring layer 60 provided with wiring layers 261 and 262 is formed on the front surface 50A side of the semiconductor substrate 50, and an organic photoelectric conversion unit (not illustrated) is formed on the back surface 50B side of the semiconductor substrate 50, the back surface 50B serving as a light-receiving surface.

An insulating film 270 is formed between the front surface 50A of the semiconductor substrate 50 and the multilayer wiring layer 60, and the insulating film 270 is formed also on the back surface 50B side of the semiconductor substrate 50 with a fixed charge film 282 therebetween.

In the semiconductor substrate 50, a through electrode 253 is formed in a manner that its lower end is connected to the wiring layer 261 via a contact 265 on the front surface 50A side of the semiconductor substrate 50, and its upper end is connected to a metal electrode 283. The metal electrode 283 is connected to the organic photoelectric conversion unit (not illustrated).

The insulating film 270 is embedded also in a through hole in which the through electrode 253 is formed. A p-type diffusion layer 281 is formed in a perimeter portion of the through hole in which the insulating film 270 is embedded.

In addition, in an area on the front surface 50A side of the semiconductor substrate 50, where the through hole is formed, an element isolation portion 252 having a STI structure is formed.

9. Production Steps of Forming Through Electrode from Substrate Front Surface Next, production steps of forming the through electrode 253 from the front surface 50A of the semiconductor substrate 50 will be described with reference to FIGS. 50 to 61.

Figure 50:
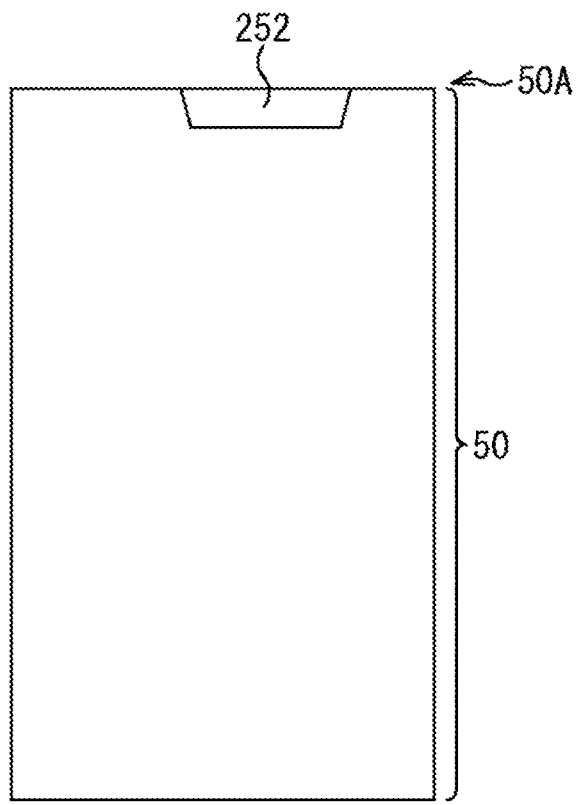
FIG. 50 is a cross-sectional view illustrating a production step of forming a through electrode from a substrate front surface.

First, as illustrated in FIG. 50, the element isolation portion 252 is formed on the front surface 50A side of the semiconductor substrate 50.

Figure 51:
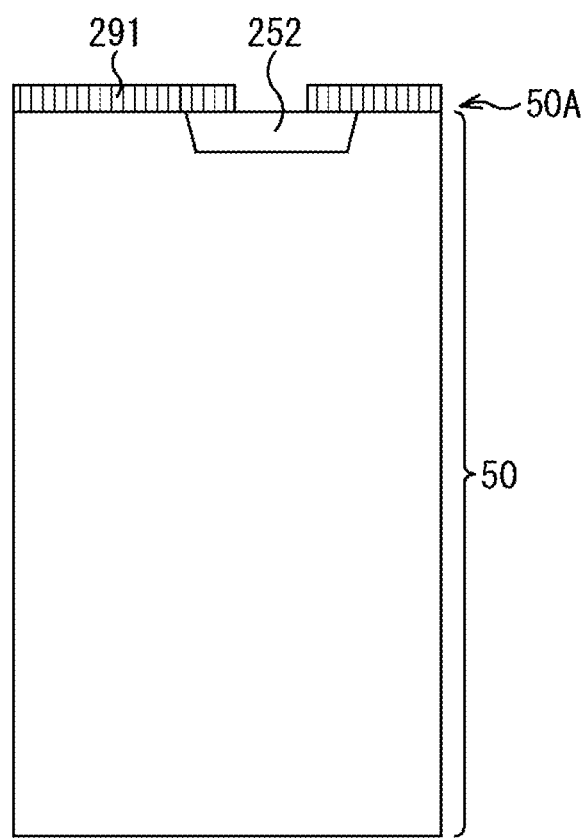
FIG. 51 is a cross-sectional view illustrating a production step of forming a through electrode from a substrate front surface.
Figure 52:
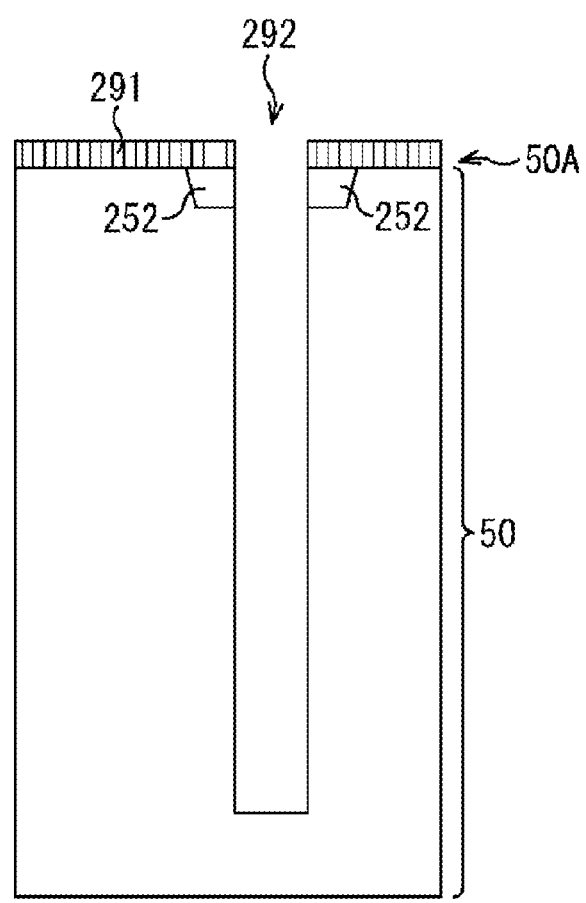
FIG. 52 is a cross-sectional view illustrating a production step of forming a through electrode from a substrate front surface.

Next, as illustrated in FIG. 51, a resist 291 is patterned in accordance with a position where the through electrode 253 is to be formed. After that, as illustrated in FIG. 52, Si (the semiconductor substrate 50) is processed by a technique such as dry etching; thus, a through hole 292 is formed.

Figure 53:
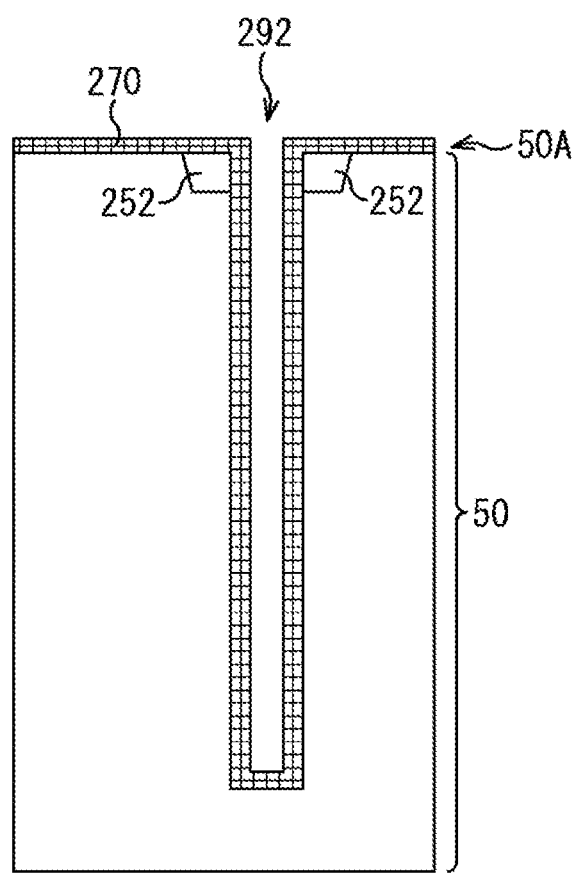
FIG. 53 is a cross-sectional view illustrating a production step of forming a through electrode from a substrate front surface.

After the resist 291 is removed, as illustrated in FIG. 53, an oxide film such as a BSG film, for example, is embedded in the through hole 292; thus, the insulating film 270 is formed.

Figure 54:
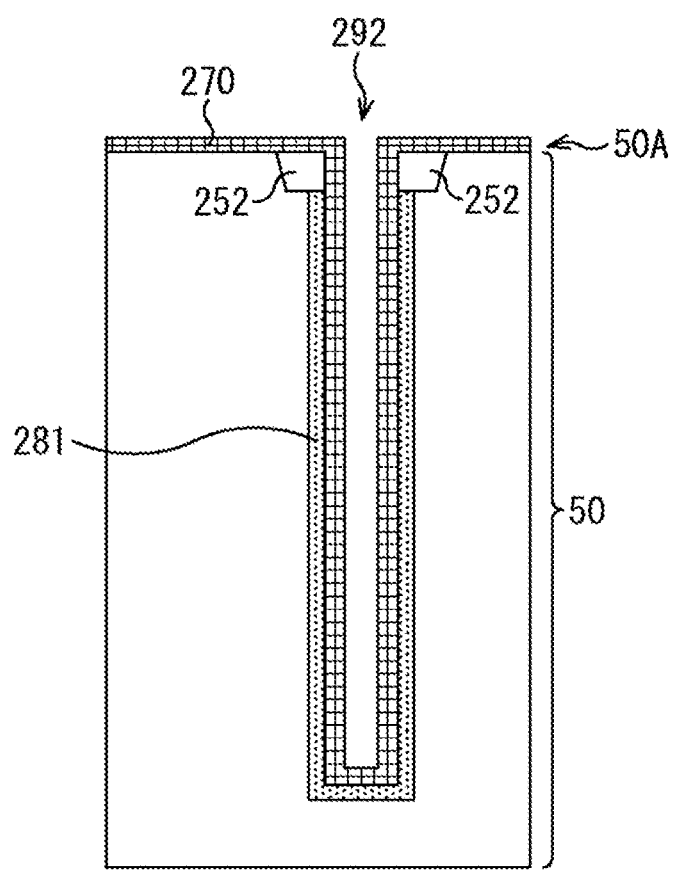
FIG. 54 is a cross-sectional view illustrating a production step of forming a through electrode from a substrate front surface.

In this state, annealing is performed on a side surface of the through hole 292; thus, as illustrated in FIG. 54, the p-type diffusion layer 281 is formed in a periphery of the through hole 292 (the semiconductor substrate 50 side).

Figure 55:
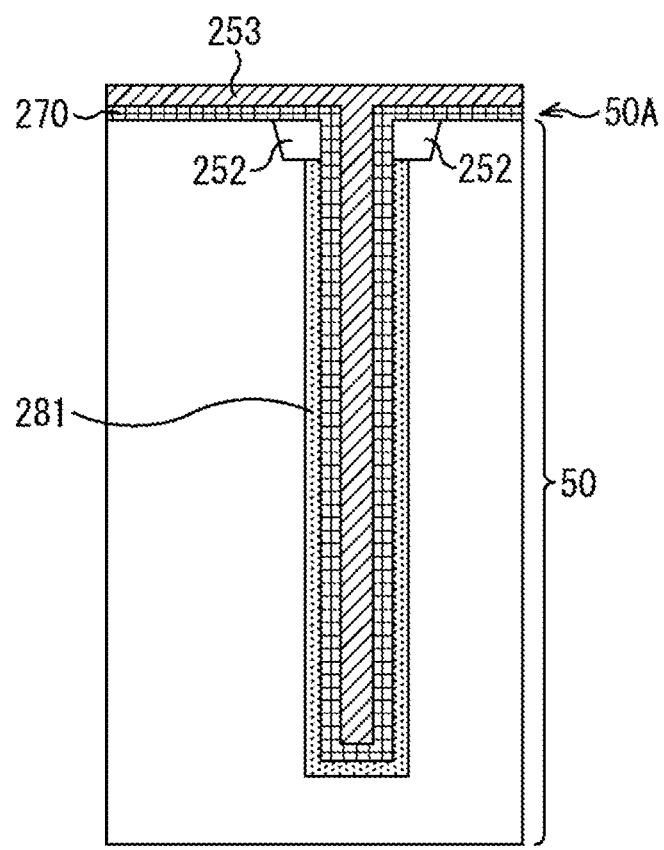
FIG. 55 is a cross-sectional view illustrating a production step of forming a through electrode from a substrate front surface.

After that, in the through hole 292, an oxide film such as a TEOS film, for example, is embedded again, and a conductive film of poly Si, doped amorphous silicon, or the like is embedded by a technique such as ALD or CVD. In this manner, as illustrated in FIG. 55, the through electrode 253 is formed.

Figure 56:
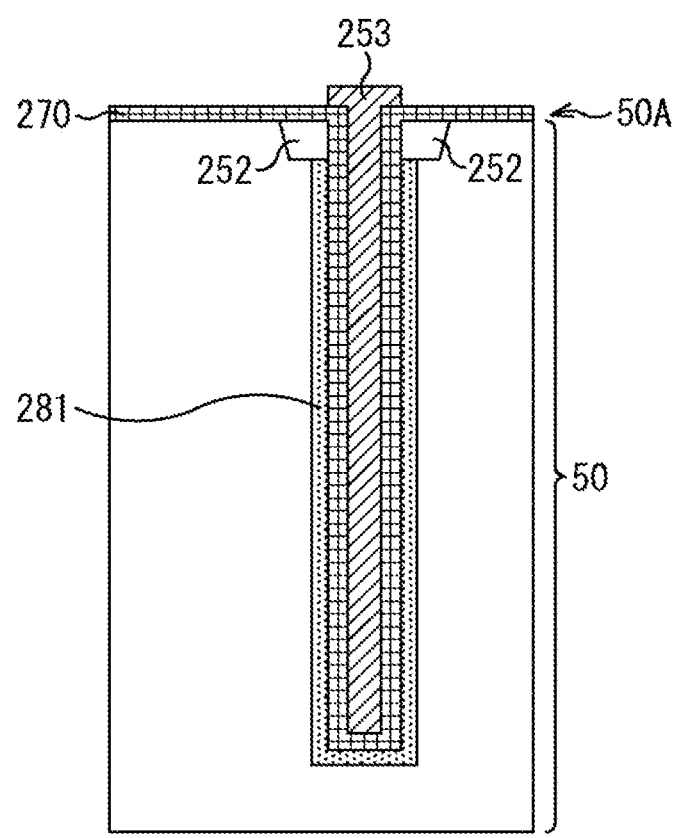
FIG. 56 is a cross-sectional view illustrating a production step of forming a through electrode from a substrate front surface.

Then, as illustrated in FIG. 56, an unnecessary conductive film on the front surface 50A of the semiconductor substrate 50 is removed by a technique such as dry etching, after patterning by photolithography.

Figure 57:
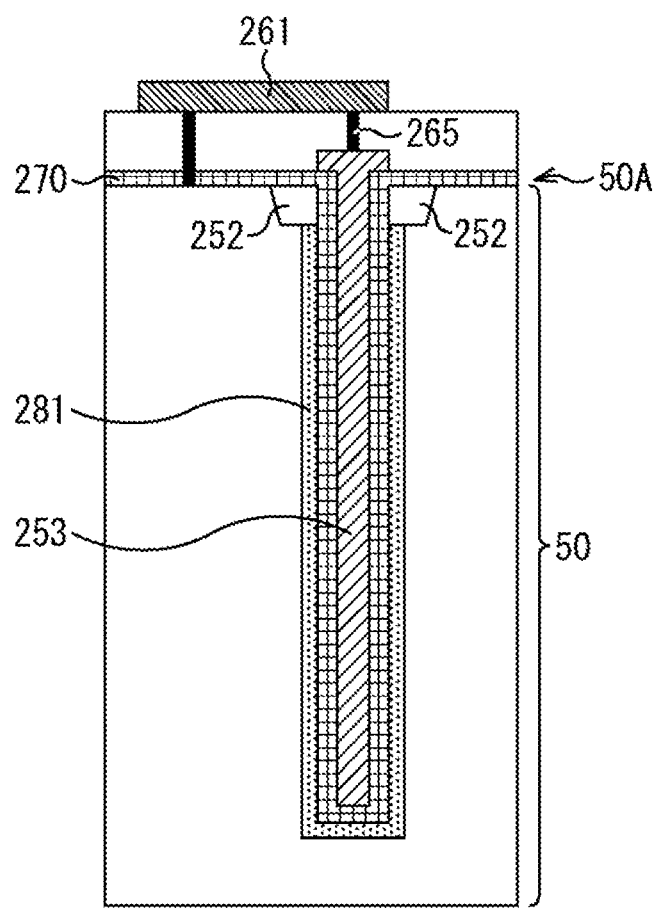
FIG. 57 is a cross-sectional view illustrating a production step of forming a through electrode from a substrate front surface.
Figure 58:
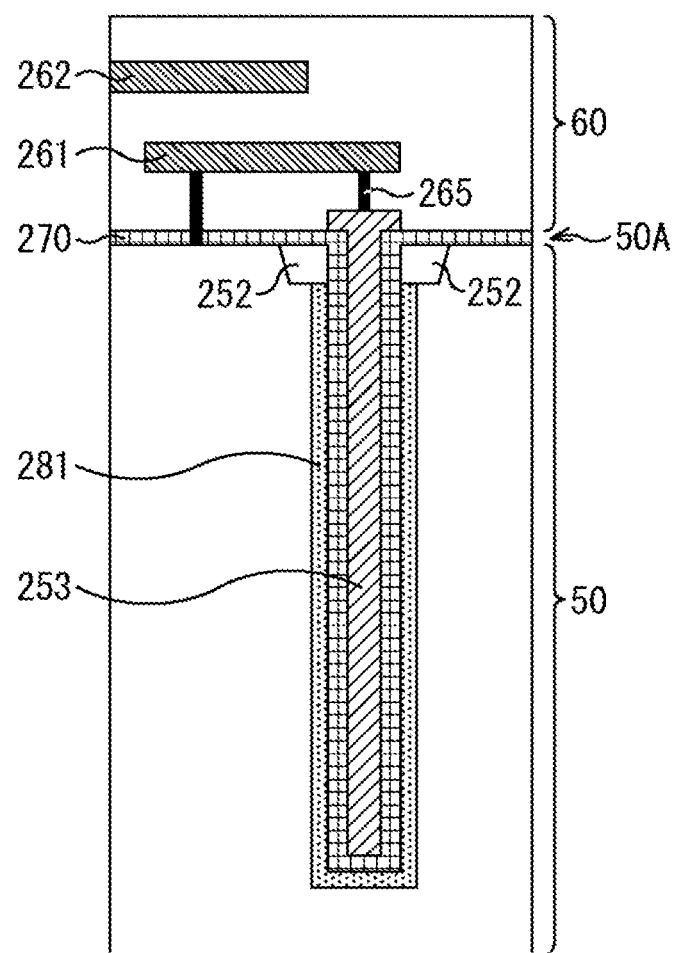
FIG. 58 is a cross-sectional view illustrating a production step of forming a through electrode from a substrate front surface.

After that, as illustrated in FIG. 57, on the front surface 50A side of the semiconductor substrate 50, the contact 265 and the wiring layer 261 connected to the through electrode 253 are formed. Furthermore, on the front surface 50A side of the semiconductor substrate 50, an insulating layer and a metal layer such as the wiring layer 262 are stacked; thus, as illustrated in FIG. 58, the multilayer wiring layer 60 is formed.

Figure 59:
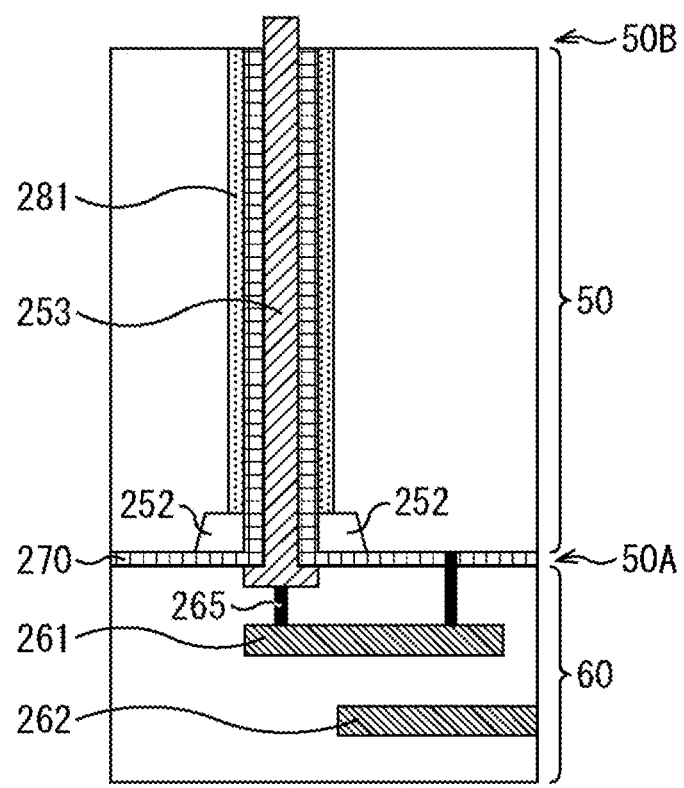
FIG. 59 is a cross-sectional view illustrating a production step of forming a through electrode from a substrate front surface.

Meanwhile, on the back surface 50B side of the semiconductor substrate 50, as illustrated in FIG. 59, Si (the semiconductor substrate 50) is polished so that one end of the through electrode 253 is exposed.

Figure 60:
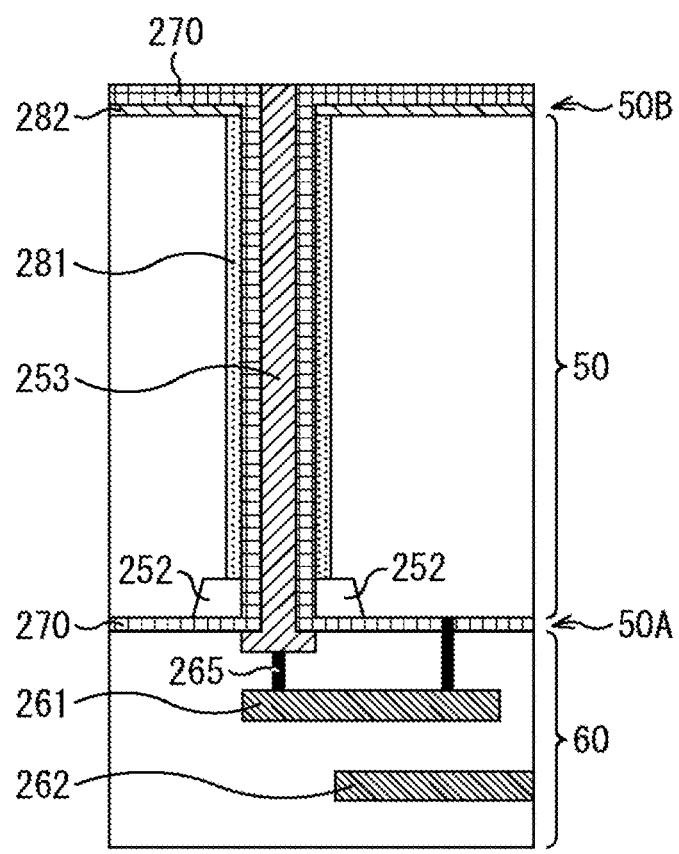
FIG. 60 is a cross-sectional view illustrating a production step of forming a through electrode from a substrate front surface.

After that, as illustrated in FIG. 60, the fixed charge film 282 is formed on the back surface 50B of the semiconductor substrate 50, and then the insulating film 270 such as an oxide film is formed.

Figure 61:
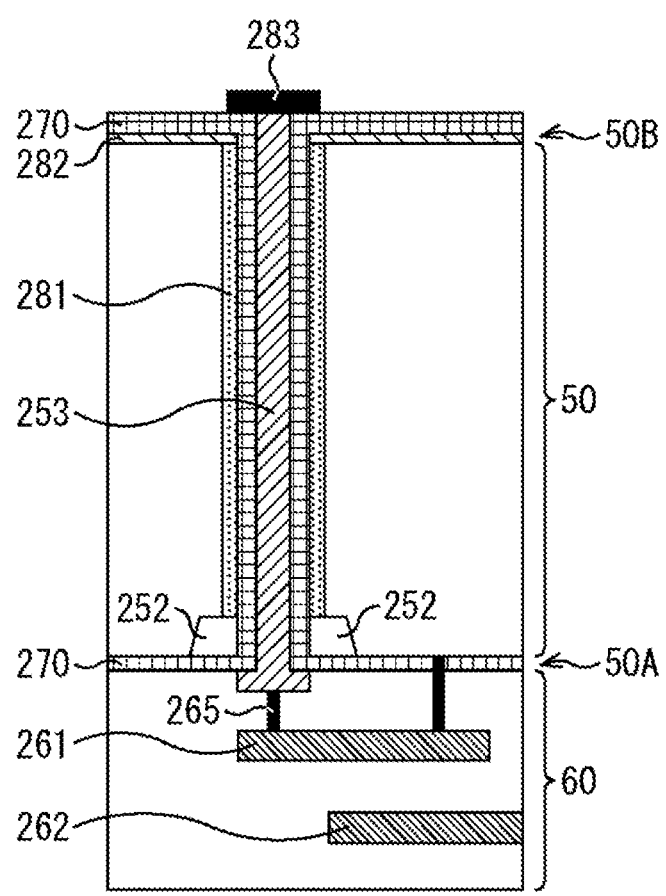
FIG. 61 is a cross-sectional view illustrating a production step of forming a through electrode from a substrate front surface.

Then, as illustrated in FIG. 61, on the back surface 50B side of the semiconductor substrate 50, the metal electrode 283 is formed on the through electrode 253.

The through electrode 253 is formed in the manner described above.

Through the above steps, the through electrode can be formed not from the back surface side of the semiconductor substrate, but from the front surface side.

The above description describes an example in which a through electrode of an embodiment of the present technology is applied to a solid-state imaging device that performs spectral diffraction in the vertical direction, but, without being limited to this example, a through electrode of an embodiment of the present technology can be applied to a configuration including a through electrode that electrically connects a first surface and a second surface of a semiconductor substrate. In addition, the above embodiments can be employed in combination with each other.

The present technology is not limited to application to solid-state imaging devices, and is also applicable to imaging devices. Here, imaging devices refer to a camera system (e.g., a digital still camera and a digital video camera) and an electronic device with an imaging function (e.g., a mobile phone). Note that a module form mounted on an electronic device, that is, a camera module, is taken as an imaging device in some cases.

10. Configuration Example of Electronic Device

Hence, a configuration example of an electronic device to which the present technology is applied will be described, with reference to FIG. 62.

Figure 62:
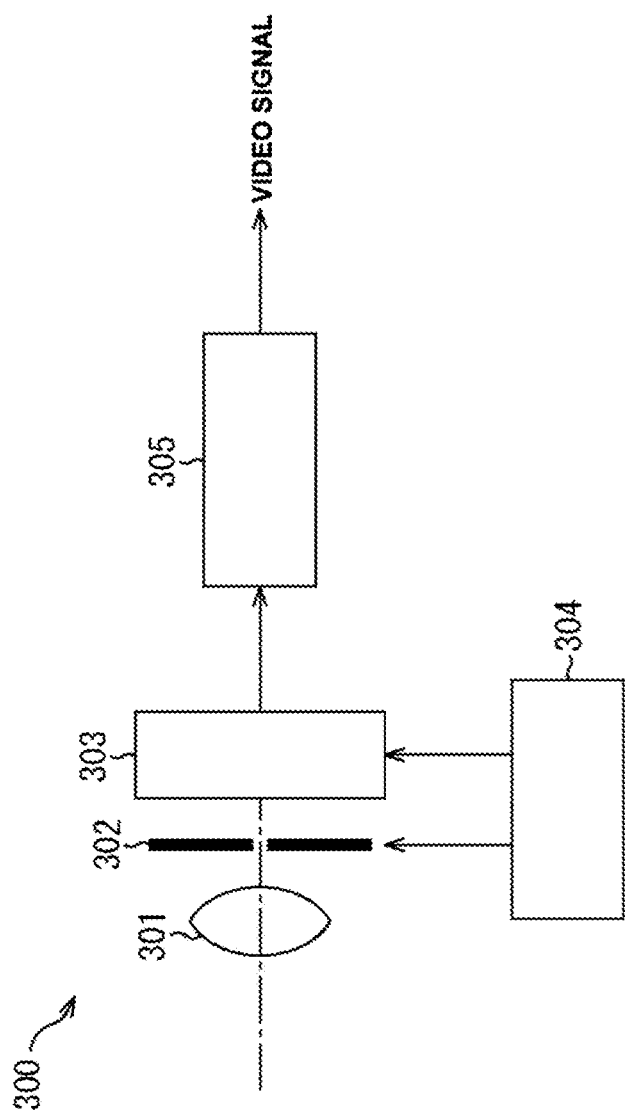
FIG. 62 is a block diagram illustrating a configuration example of an electronic device of an embodiment of the present technology.

An electronic device 300 illustrated in FIG. 62 includes an optical lens 301, a shutter device 302, a solid-state imaging device 303, a drive circuit 304, and a signal processing circuit 305. FIG. 62 illustrates an embodiment in which the solid-state imaging device 10 of an embodiment of the present technology described above is provided in an electronic device (digital still camera) as the solid-state imaging device 303.

The optical lens 301 causes image light (incident light) from an object to form an image on an imaging surface of the solid-state imaging device 303. Thus, signal charge is accumulated in the solid-state imaging device 303 for a certain period. The shutter device 302 controls a light irradiation period and a light blocking period for the solid-state imaging device 303.

The drive circuit 304 supplies drive signals to the shutter device 302 and the solid-state imaging device 303. The drive signal supplied to the shutter device 302 is a signal for controlling shutter operation of the shutter device 302. The drive signal supplied to the solid-state imaging device 303 is a signal for controlling signal transfer operation of the solid-state imaging device 303. The solid-state imaging device 303 performs signal transfer in accordance with the drive signal (timing signal) supplied from the drive circuit 304. The signal processing circuit 305 performs various signal processing on signals output from the solid-state imaging device 303. Video signals that have undergone signal processing are stored in a storage medium, such as a memory, or output to a monitor.

11. Usage Examples of Image Sensor

Lastly, usage examples of the image sensor to which the present technology is applied will be described.

Figure 63:
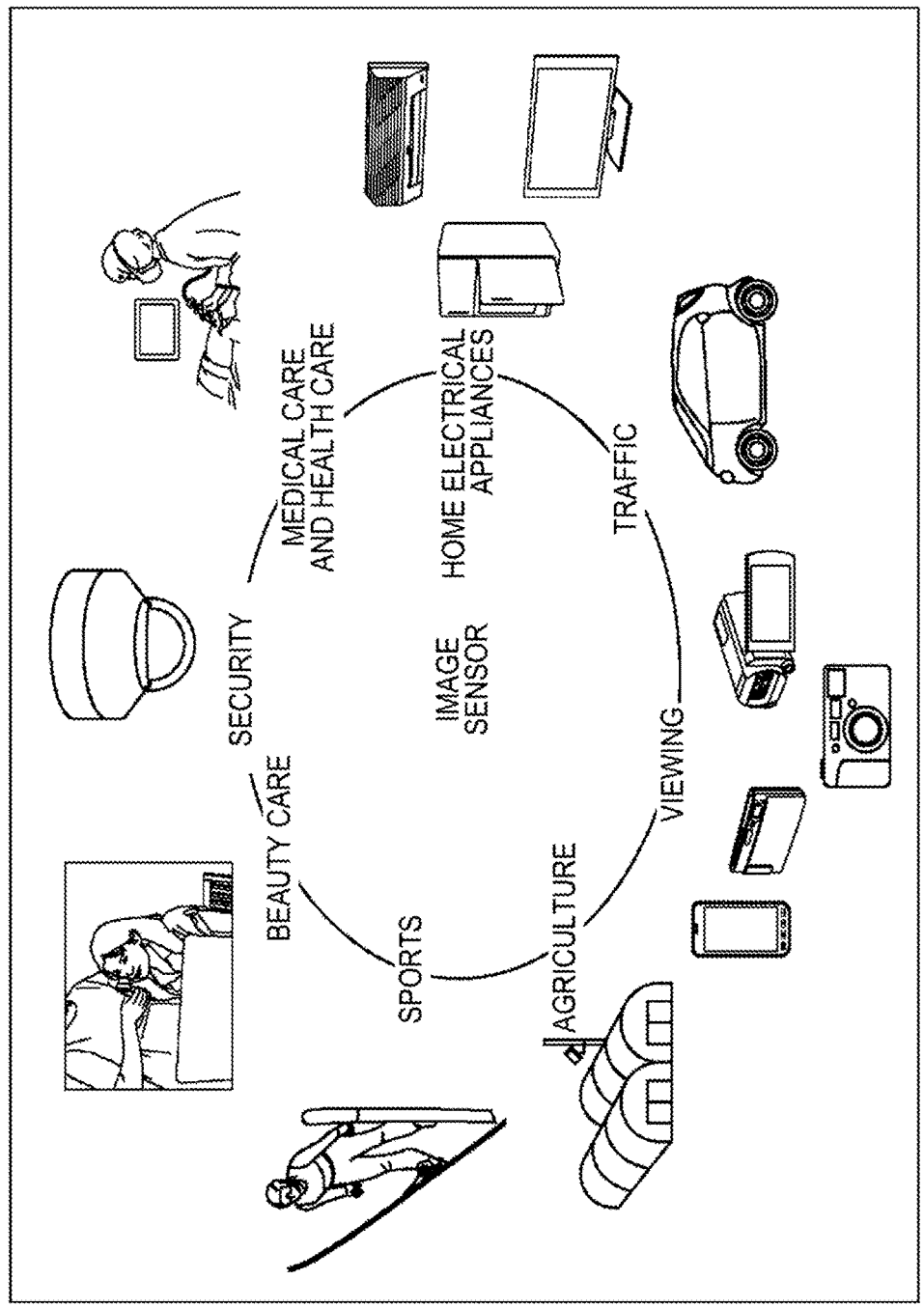
FIG. 63 illustrates usage examples of an image sensor.

FIG. 63 illustrates the usage examples of the above-described image sensor.

The above-described image sensor can be used for, for example, various cases in which light such as visible light, infrared light, ultraviolet light, or X-rays is detected as follows.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to take images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

In addition, embodiments of the present disclosure are not limited to the above-described embodiments, and various alterations may occur insofar as they are within the scope of the present disclosure.

Additionally, the present technology may also be configured as below.

(1)

A solid-state imaging device including:

a wiring layer provided on a first surface side of a semiconductor substrate;

a photoelectric conversion element provided on a second surface side of the semiconductor substrate; and a through electrode provided in a manner that one end penetrates the first surface to be connected to the wiring layer and the other end is connected to the photoelectric conversion element.

(2)

The solid-state imaging device according to (1), in which the through electrode is provided for each pixel, and the other end of the through electrode is connected to an electrode provided for each pixel in the photo-electric conversion element, and the wiring layer is provided for each pixel and is connected to a floating diffusion and an amplification transistor.

(3)

The solid-state imaging device according to (1) or (2), in which the wiring layer is provided closer to the second surface than another wiring layer is.

(4)

The solid-state imaging device according to any one of (1) to (3), in which the wiring layer is formed of W or Ti.

(5)

The solid-state imaging device according to (2), in which at least one photoelectric conversion unit is provided for each pixel in the semiconductor substrate.

(6)

The solid-state imaging device according to (1), in which the other end of the through electrode is connected to an electrode provided to be shared by pixels in the photoelectric conversion element, and the wiring layer is connected to a power supply line.

(7)

The solid-state imaging device according to (6), in which the wiring layer is connected to the power supply line via a gate electrode.

(8)

The solid-state imaging device according to (7), in which the gate electrode is provided on an element isolation film.

(9)

The solid-state imaging device according to (1), wherein the through electrode is formed of W, Cu, Al, Ti, Co, Hf, or Ta.

(10)

The solid-state imaging device according to (1), wherein a tip of the through electrode on the wiring layer side has a tapered shape.

(11)

The solid-state imaging device according to (1), wherein in a through hole in which the through electrode is provided, a fixed charge film is formed, and an insulating film is formed on the fixed charge film, and the insulating film is formed so as to prevent the through electrode and the fixed charge film from being in contact with each other at a side surface of an opening portion of the through hole on the first surface side.

(12)

The solid-state imaging device according to (11), wherein in the through hole, a first insulating film is formed on the fixed charge film, and a second insulating film is formed on an opening portion obtained by opening part of a bottom of the through hole on the first surface side, and the second insulating film is formed so as to prevent the through electrode and the fixed charge film from being in contact with each other at a side surface of the opening portion.

(13)

The solid-state imaging device according to (12), wherein the second insulating film has higher insulation properties than the fixed charge film.

(14)

The solid-state imaging device according to (11), wherein in the through hole, the fixed charge film is formed, and the insulating film is formed on an opening portion obtained by opening a bottom of the through hole on the first surface side.

(16)

The method for producing a solid-state imaging device according to (15), wherein the through electrode is provided in a manner that one end penetrates the first surface to be connected to the wiring layer by using Bosch process.

(17)

The method for producing a solid-state imaging device according to (15), wherein a high-concentration impurity area is provided in an area where the through electrode is to be provided in the semiconductor substrate.

(18)

The method for producing a solid-state imaging device according to (15), wherein the through electrode is provided from the second surface side of the semiconductor substrate.

(19)

The method for producing a solid-state imaging device according to (15), wherein the through electrode is provided from the first surface side of the semiconductor substrate.

(20)

A method for producing a solid-state imaging device, the method including:

providing a wiring layer on a first surface side of a semiconductor substrate;

providing a through electrode in a manner that one end penetrates the first surface to be connected to the wiring layer; and providing a photoelectric conversion element on a second surface side of the semiconductor substrate in a manner that the other end of the through electrode is connected to the photoelectric conversion element.

(21)

An electronic device including a solid-state imaging device including a wiring layer provided on a first surface side of a semiconductor substrate, a photoelectric conversion element provided on a second surface side of the semiconductor substrate, and a through electrode provided in a manner that one end penetrates the first surface to be connected to the wiring layer and the other end is connected to the photoelectric conversion element.

(22)

An imaging device, comprising:

a semiconductor substrate having a first side and a second side opposite the first side;

a photoelectric conversion unit on the first side of the semiconductor substrate;

a multilayer wiring layer on the second side of the semiconductor substrate;

a through electrode that extends between the photoelectric conversion unit and the multilayer wiring layer, wherein the multilayer wiring layer includes a local wiring layer, and wherein a second end of the through electrode is in direct contact with the local wiring layer.

(23)

The imaging device of (22), wherein the photoelectric conversion unit includes a lower electrode, and wherein a first end of the through electrode is in direct contact with the lower electrode.

(24)

The imaging device of (23), wherein the semiconductor substrate includes a light incident surface at the first side of the semiconductor substrate.

(25)

The imaging device of (24), further comprising an interlayer insulating film between a front surface of the semiconductor substrate and the local wiring, wherein the front surface is at the second side of the semiconductor substrate, and wherein the local wiring layer is separated from the front surface of the semiconductor substrate by the interlayer insulating film.

(26)

The imaging device of (24), further comprising an insulating film between the lower electrode and the light incident surface of the semiconductor substrate.

(27)

The imaging device of (22), wherein the through electrode is formed from a metal.

(28)

The imaging device of (22), wherein the through electrode is formed from at least one of Al, Ti, Co, Hf, Ta, Cu, and W.

(29)

The imaging device of (23), wherein the first end of the through electrode has a width that is greater than a width of the second end of the through electrode.

(30)

The imaging device of (22), wherein the second end of the through electrode is tapered.

(31)

The imaging device of (22), further comprising a plurality of pixels, wherein each of the pixels includes a first photodiode formed in the semiconductor substrate and a second photodiode formed in the semiconductor substrate.

(32)

An electronic apparatus, comprising:

a plurality of pixels, wherein each of the pixels includes:

a photoelectric conversion unit on the first side of the semiconductor substrate;

at least a first photodiode formed in the semiconductor substrate;

a multilayer wiring layer on the second side of the semiconductor substrate;

a through electrode that extends between the photoelectric conversion unit and the multilayer wiring layer, wherein the multilayer wiring layer includes a local wiring layer, and wherein a second end of the through electrode is in direct contact with the local wiring layer.

(33)

The electronic apparatus of (32), wherein the photoelectric conversion unit includes a lower electrode, and wherein a first end of the through electrode is in direct contact with the lower electrode.

(34)

The electronic apparatus of (32), wherein the through electrode is formed from at least one of Al, Ti, Co, Hf, Ta, Cu, and W.

(35)

The electronic apparatus of (33), wherein the first end of the through electrode has a width that is greater than a width of the second end of the through electrode.

(36)

The electronic apparatus of (32), wherein the second end of the through electrode is tapered.

(37)

The electronic apparatus of (32), wherein each of the pixels further includes a second photodiode formed in the semiconductor substrate.

REFERENCE SIGNS LIST 10 solid-state imaging device
20 pixel
50 semiconductor substrate
51, 52 inorganic photoelectric conversion unit
53 FD
54 transfer transistor
55 amplification transistor
55G gate electrode
55s element isolation portion
56 reset transistor
56G gate electrode
56s element isolation portion
57 etch stop layer
58 through electrode
60 multilayer wiring layer
61 local wiring layer
62, 63 wiring layer
70 insulating film
80 organic photoelectric conversion unit
81 lower electrode
82 upper electrode
83 organic photoelectric conversion layer
91 passivation film
92 on-chip lens
151 transistor
151G gate electrode
152 element isolation film
153 through electrode
153a lead-out wiring layer
153b, 153c contact
153d wiring layer
161 local wiring layer
163 wiring layer
171 fixed charge film
172 insulating film
181 through hole
300 electronic device
303 solid-state imaging device

The invention claimed is:

1. An imaging device, comprising:
a semiconductor substrate having a first side and a second side opposite the first side;
a photoelectric conversion unit on the first side of the semiconductor substrate;
a multilayer wiring layer on the second side of the semiconductor substrate;
a through electrode that extends between the photoelectric conversion unit and the multilayer wiring layer, wherein the through electrode penetrates the multilayer wiring layer between an amplification transistor and a reset transistor.

2. The imaging device of claim 1, wherein the photoelectric conversion unit includes a lower electrode, and wherein a first end of the through electrode is in direct contact with the lower electrode.

3. The imaging device of claim 2, wherein the semiconductor substrate includes a light incident surface at the first side of the semiconductor substrate.

4. The imaging device of claim 3, further comprising an interlayer insulating film between a front surface of the semiconductor substrate and a local wiring layer, wherein the front surface is at the second side of the semiconductor substrate, and wherein the local wiring layer is separated from the front surface of the semiconductor substrate by the interlayer insulating film.

5. The imaging device of claim 3, further comprising an insulating film between the lower electrode and the light incident surface of the semiconductor substrate.

6. The imaging device of claim 1, wherein the through electrode is formed from a metal.

7. The imaging device of claim 1, wherein the through electrode is formed from at least one of Al, Ti, Co, Hf, Ta, Cu, and W.

8. The imaging device of claim 2, wherein the first end of the through electrode has a width that is greater than a width of a second end of the through electrode.

9. The imaging device of claim 1, wherein a second end of the through electrode is tapered.

10. The imaging device of claim 1, further comprising a plurality of pixels, wherein each of the plurality of pixels includes a first photodiode formed in the semiconductor substrate and a second photodiode formed in the semiconductor substrate.

11. An electronic apparatus, comprising: a plurality of pixels, wherein each of the plurality of pixels includes:
a photoelectric conversion unit on a first side of a semiconductor substrate;
at least a first photodiode formed in the semiconductor substrate;
a multilayer wiring layer on a second side of the semiconductor substrate;
a through electrode that extends between the photoelectric conversion unit and the multilayer wiring layer, wherein the through electrode penetrates the multilayer wiring layer between an amplification transistor and a reset transistor.

12. The electronic apparatus of claim 11, wherein the photoelectric conversion unit includes a lower electrode, and wherein a first end of the through electrode is in direct contact with the lower electrode.

13. The electronic apparatus of claim 11, wherein the through electrode is formed from at least one of Al, Ti, Co, Hf, Ta, Cu, and W.

14. The electronic apparatus of claim 12, wherein the first end of the through electrode has a width that is greater than a width of a second end of the through electrode.

15. The electronic apparatus of claim 11, wherein a second end of the through electrode is tapered.

16. The electronic apparatus of claim 11, wherein each of the plurality of pixels further includes a second photodiode formed in the semiconductor substrate.

* * * * *